United States Patent
Iketani et al.

(10) Patent No.: US 10,362,687 B2
(45) Date of Patent: Jul. 23, 2019

(54) SIMULTANEOUS AND SELECTIVE WIDE GAP PARTITIONING OF VIA STRUCTURES USING PLATING RESIST

(71) Applicant: SANMINA CORPORATION, San Jose, CA (US)

(72) Inventors: Shinichi Iketani, San Jose, CA (US); Dale Kersten, San Jose, CA (US)

(73) Assignee: SANMINA CORPORATION, San Jose, CA (US)

( * ) Notice: Subject to any disclaimer, the term of this patent is extended or adjusted under 35 U.S.C. 154(b) by 0 days.

(21) Appl. No.: 16/181,180

(22) Filed: Nov. 5, 2018

(65) Prior Publication Data

US 2019/0075662 A1   Mar. 7, 2019

Related U.S. Application Data

(62) Division of application No. 15/723,135, filed on Oct. 2, 2017, now Pat. No. 10,123,432, which is a division
(Continued)

(51) Int. Cl.
H05K 3/42 (2006.01)
H05K 3/46 (2006.01)
(Continued)

(52) U.S. Cl.
CPC ............. *H05K 3/429* (2013.01); *H05K 1/115* (2013.01); *H05K 1/0251* (2013.01);
(Continued)

(58) Field of Classification Search
CPC ........ H05K 1/112; H05K 1/115; H05K 1/116; H05K 3/429; H05K 3/4038; H05K 3/4069;
(Continued)

(56) References Cited

U.S. PATENT DOCUMENTS 6,747,217 B1   6/2004  Jochym et al.
9,781,830 B2  10/2017  Iketani et al.
(Continued)

FOREIGN PATENT DOCUMENTS

CN   101133478 A    2/2008
JP   H02281689 A   11/1990
(Continued)

OTHER PUBLICATIONS

International Search Report & Written Opinion for PCT/US14/30144, 14 pages (dated Dec. 11, 2014).

*Primary Examiner* — Hoa C Nguyen
(74) *Attorney, Agent, or Firm* — Loza & Loza, LLP; Julio M. Loza

(57) ABSTRACT

A multilayer printed circuit board is provided having a first dielectric layer and a first plating resist selectively positioned in the first dielectric layer. A second plating resist may be selectively positioned in the first dielectric layer or a second dielectric layer, the second plating resist separate from the first plating resist. A through hole extends through the first dielectric layer, the first plating resist, and the second plating resist. An interior surface of the through hole is plated with a conductive material except along a length between the first plating resist and the second plating resist. This forms a partitioned plated through hole having a first via segment electrically isolated from a second via segment.

6 Claims, 24 Drawing Sheets

Related U.S. Application Data of application No. 14/205,331, filed on Mar. 11, 2014, now Pat. No. 9,781,844.

(60) Provisional application No. 61/801,134, filed on Mar. 15, 2013.

(51) Int. Cl.
*H05K 1/11* (2006.01)
*H05K 1/02* (2006.01)

(52) U.S. Cl.
CPC ............... *H05K 2201/0187* (2013.01); *H05K 2201/09536* (2013.01); *H05K 2201/09645* (2013.01); *H05K 2203/061* (2013.01); *H05K 2203/0713* (2013.01); *Y10T 29/49165* (2015.01)

(58) Field of Classification Search
CPC .................. H05K 3/4061; H05K 3/42; H05K 3/421–3/425
USPC .......................................... 174/262, 264–266
See application file for complete search history.

(56) References Cited

U.S. PATENT DOCUMENTS

| | | |
|---|---|---|
| 2005/0079289 A1 | 4/2005 | Farquhar et al. |
| 2009/0288874 A1 | 11/2009 | Dudnikov, Jr. et al. |
| 2014/0001150 A1* | 1/2014 | Lecesse ................ H05K 3/429 216/18 |
| 2016/0021762 A1* | 1/2016 | Kallman ................ H05K 3/429 174/266 |

FOREIGN PATENT DOCUMENTS

| | | |
|---|---|---|
| JP | 2003204157 A | 7/2003 |
| JP | 2004207568 A | 7/2004 |

* cited by examiner (Ideal Structure)

(Practical Structure)

US 10,362,687 B2

SIMULTANEOUS AND SELECTIVE WIDE GAP PARTITIONING OF VIA STRUCTURES USING PLATING RESIST

CLAIM OF PRIORITY UNDER 35 U.S.C. § 119

The present Application for Patent is a divisional application of U.S. patent application Ser. No. 15/723,135 filed Oct. 2, 2017, and issued Nov. 6, 2018 as U.S. Pat. No. 10,123,432, which is a divisional application of U.S. patent application Ser. No. 14/205,331, filed Mar. 11, 2014, and issued Oct. 3, 2017 as U.S. Pat. No. 9,781,844, which claims priority to U.S. Provisional U.S. Patent Application No. 61/801,134, filed Mar. 15, 2013, which is assigned to the assignee hereof and hereby expressly incorporated by reference in their entirety.

FIELD OF THE INVENTION

The present invention relates to printed circuit boards (PCBs), and more particularly, to systems and methods for simultaneously partitioning a via structure into electrically isolated portions by using plating resist within a PCB stackup for allowing a plurality of electrical signals to traverse each electrically isolated portion without interference from each other.

BACKGROUND

Consumers are increasingly demanding both faster and smaller electronic products. The use of PCBs has grown enormously as new electronic applications are marketed. A PCB is formed by laminating a plurality of conducting layers with one or more non-conducting layers. As the size of a PCB shrinks, the relative complexity of its electrical interconnections grows.

A plated via structure is traditionally used to allow signals to travel between layers of a PCB. The plated via structure is a plated hole within the PCB that acts as a medium for the transmission of an electrical signal. For example, an electrical signal may travel through a trace on one layer of the PCB, through the plated via structure's conductive material, and then into a second trace on a different layer of the PCB.

Unfortunately, due to limitations within the prior art, the plated via structure may be longer than necessary to perform the function of electrical connectivity. For example, the plated via structure may extend completely through the PCB but only connect two traces on two proximate adjacent layers. As a result, one or more stubs may be formed. A stub is excessive conductive material within the plated via structure which is not necessary to transport the electrical signal.

When a high speed signal is transmitted through the plated via structure, a "stub effect" may distort the signal. The stub effect is a result of the useless excess conductive material present within the plated via structure. The stub effect occurs when a portion of the signal is diverted away from the trace connections and into one or more stubs of the plated via structure. The portion of the signal may be reflected from the end of the stub back toward the trace connections after some delay. This delayed reflection may interfere with signal integrity and increase, for example, the bit error rate of the signal. The degenerating effect of the stub effect may increase with the length of the stub. As much as 50% of signal attenuation at signals running at 10 Gigabits per second may be due to the stub in the plated via structure. Via structures with short stubs can be manufactured but require sequential processing, which increases costs substantially.

FIG. 1 is an illustration of a PCB 100 with a plated via structure 110 and a stub 170 in the prior art. The PCB 100 consists of conducting layers 130 separated by nonconductive dielectric layers 120. Typically, the plated via structure 110 includes a barrel (i.e., shaft of the via structure) that is cylindrical in shape and is plated with a conductive material 180. The plated via structure 110 allows an electrical signal 160 to transmit from a trace 140 on a first conducting layer 130 of the PCB 100 to a trace 150 on a second conducting layer 130. The stub 170 of the plated via structure 110 is the unnecessary portion of the plated via structure 110, which may create the stub effect.

FIG. 2 is an illustration of the PCB 100 with the plated via structure 110 after the stub 170 (shown in FIG. 1) has been removed by backdrilling in the prior art. Backdrilling the unnecessary portion of the plated via structure 110 to reduce or remove the stub 170 is one method to reduce the stub effect. Backdrilling is a viable alternative to sequential layer processing but has limitations. Typically, a drill bit backdrills the stub 170 thereby removing a portion of the unnecessary excess conductive material of the plated via structure 110. A backdrilled hole 200 is created once the drill bit removes a portion of the stub 170 from the plated via structure 110. The drill bit is commonly a carbide drill bit in a computer numerically controlled (CNC) drill machine. As a result of backdrilling, the portion of the stub 170 of the plated via structure 110 is removed, thereby reducing, but not completely eliminating, parasitic capacitance, parasitic inductance, and time delay, which may interfere with signal integrity.

In most cases, design concessions need to be made to allow for deviations in the accuracy of the drilling equipment. If the backdrilling is inaccurate (e.g. too deep or off center), then a functional portion of the plated via structure 110 may be removed and the PCB 100 may be ruined. As a consequence, a new PCB 100 must be reconstructed and backdrilled. Thus, yields are reduced and costs are increased.

The backdrilling process is also limited in the tolerances that can be reliably held. Backdrilling is typically only controllable to a depth tolerance of +/−5 mils. In many cases, further design concessions need to be made due to limitations in the strength and consistency of the layers to allow for variations in the placement, width, and direction of drilling.

Yet another limitation is that many designs require the backdrilling of multiple plated via structures 110 where the stubs 170 may be at different depths. This requires specialized programming of the drill tool files, which takes time and money to produce.

Further, backdrilling multiple plated via structures 110 typically is a serial process, so that the time needed to backdrill the PCB 100 increases with the number of stubs 170. If any one of the stubs 170 is drilled improperly, the PCB 100 may be ruined. Therefore, backdrilling a number of stubs 170 increases the probability of damage to the PCB 100.

Another limitation is that many designs also require stubs to be removed from both surfaces of the PCB 100. This requires that the PCB 100 be reoriented during the backdrilling process, which further takes time, requires additional programming, and adds potential error to the accuracy of the backdrilling process.

Further, drill bits are prone to breakage which reduces yields and requires rework of the PCB 100. The process of reworking each individual plated via structure 110 adds cycle time and increases costs in production. Moreover, drill bits are expensive, which further drives up costs.

One consequence of backdrilling is that the volume of the removed stub barrel is not functional in the context of circuit routing. No other trace or interconnect on any layer can pass through the volume of the removed stub. Circuit traces need to be re-routed around such volumes. In most cases, additional layers need to be added to effectively route all the traces in a given design and thus add to complexity and cost.

PCBs can be split into two or more sections to reduce stub lengths or increase wiring density using methods known in the art such as sequential processing techniques. With sequential processing, two separate PCB subassemblies are individually manufactured. The two subassemblies are subsequently laminated together and through-holes or vias are plated to connect the two individual PCBs into one. Stubs can be controlled in this manner, but are limited to the layers between the two individual sub-assemblies. Because of the "sequential nature" of such a lamination process, additional process steps are required and cost and cycle time to manufacture is significantly increased.

DETAILED DESCRIPTION OF THE INVENTION

A cost effective and efficient system to minimize signal degradation is to electrically isolate, reduce, or eliminate a stub by controlling the formation of a conductive material within a plated via structure of a printed circuit board (PCB). One or more areas of plating resists within the via structure are used to resist the formation of conductive material by intentionally creating one or more voids in the via structure. As a result, the formation of conductive material within the via structure may be limited to those areas necessary for the transmission of electrical signals. According to certain embodiments, the partitioning of the via structure into electrically isolated segments can dramatically increase the route capabilities or wiring density of a PCB design. This is because each electrically isolated segment of the partitioned via can be used to electrically connect signals on layers associated that particular segment.

A multilayer PCB can be a chip substrate, a motherboard, a backplane, a backpanel, a centerplane, a flex or rigid flex circuit. The invention is not restricted to use in PCBs. A via structure can be a plated through-hole used for transmitting electrical signals from one conducting layer to another. A plated via structure can also be a component mounting hole for electrically connecting an electrical component to other electrical components on the PCB.

The methods to electrically isolate, reduce, or eliminate a stub within via structures of PCBs may be faster and more efficient than backdrilling. Plating resists may be placed within the many clearances in the conducting and/or dielectric layers of the PCB simultaneously. In most cases PCBs can have through-holes and vias in the order of 100,000 plus. At the same time, the multi-layer PCB can have multiple layers. It would be advantageous to partition each of the vias and control the stub to variable degrees for each via. In other words, each via can be partitioned at different layers and at different locations. To be able to partition all the vias simultaneous on a single panel, plating resist can be selectively deposited on a selected layer of each sub-composite core during the making of the PCB stackup prior to drilling and subsequent plating of the vias in the panel. For example, all the clearances within a layer of a PCB may be formed concurrently. In another example, the conductive material may be formed within all of the via structures of a PCB at the same time. In contrast, as discussed previously, backdrilling is generally performed upon one via structure at a time. Thus, methods incorporating plating resists to limit stub formation may allow for faster production of PCBs than backdrilling.

Figure 1:
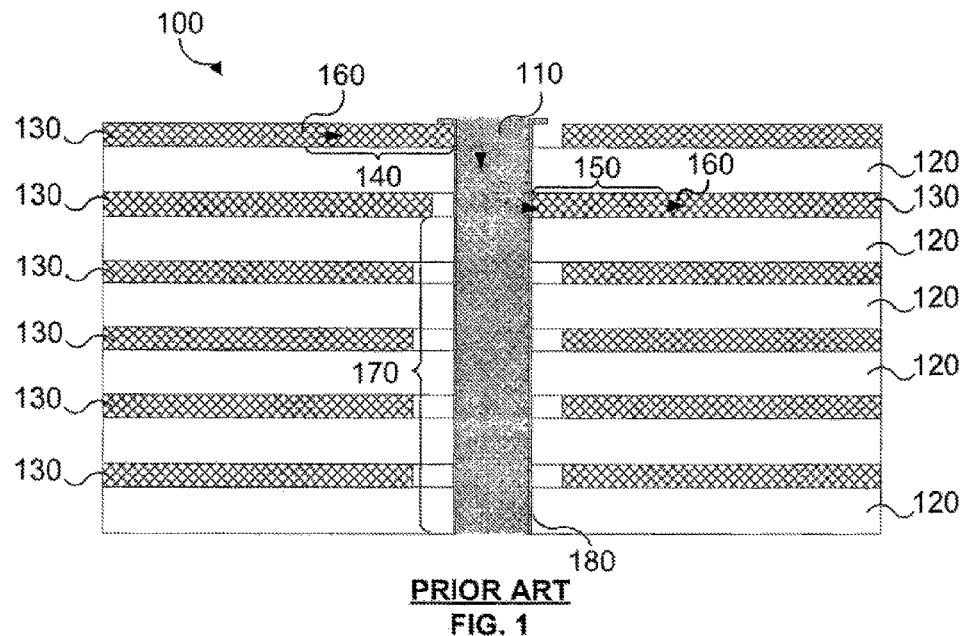
FIG. 1 is an illustration of a PCB with a plated via structure and a stub in the prior art.
Figure 2:
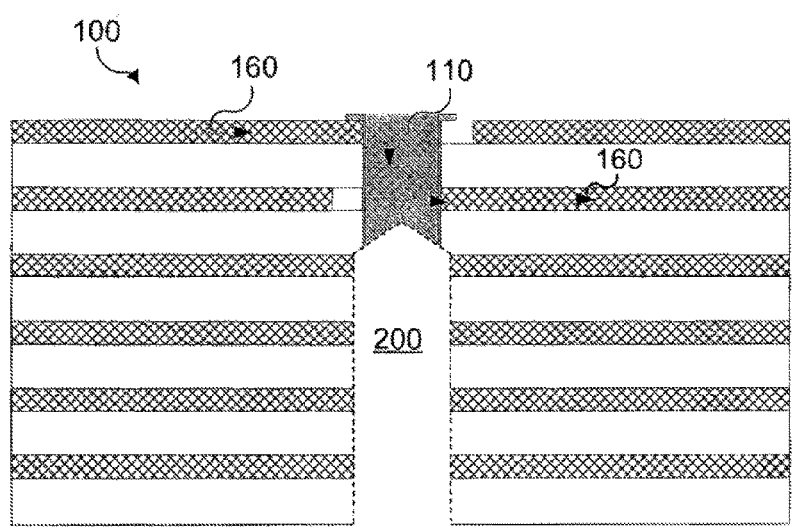
FIG. 2 is an illustration of the PCB with the plated via structure after the stub has been removed by backdrilling in the prior art.
Figure 3:
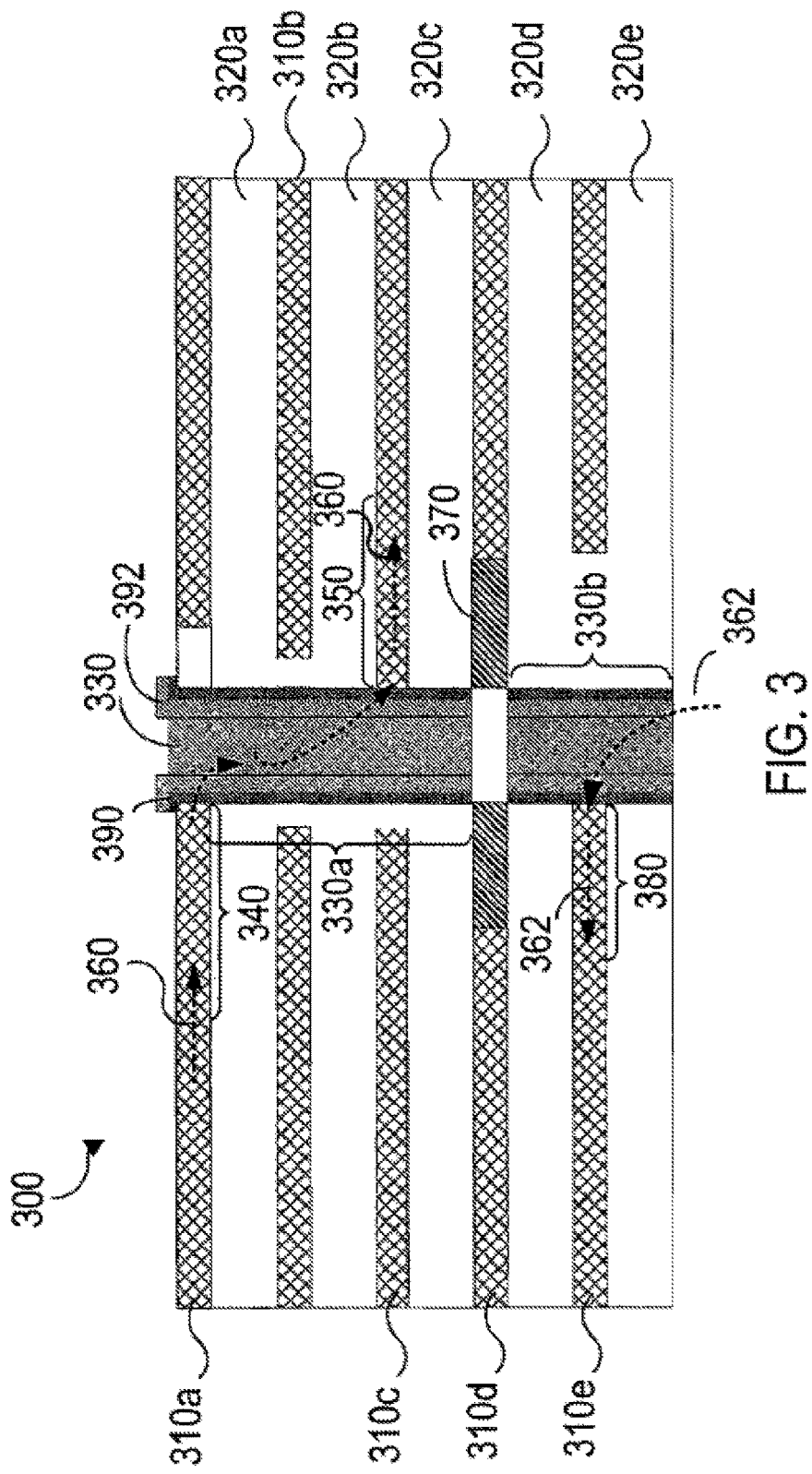
FIG. 3 is an illustration depicting a PCB with a plated via structure formed through a plating resist, according to certain embodiments.

FIG. 3 is an illustration depicting a PCB 300 with a plated via structure 330 formed through a plating resist 370, according to certain embodiments. The PCB 300 includes conducting layers 310a-310e separated by dielectric layers 320a-320e. The plated via structure 330 is plated with a seed conductive material 390 and a further coating of conductive material 392. The plated via 330 is effectively partitioned into a plurality of electrically isolated portions (330a, and 330b) by selectively depositing plating resist in a subcomposite structure for making the PCB stackup. A method of partitioning a plated via such as plated via 330 is described herein with reference to FIGS. 4 to 8.

FIG. 3 shows that the plated via allows an electrical signal 360 to transmit from one trace 340 or component mounting pad on a first conducting layer 310a to another trace 350 on a second conducting layer 310b of the PCB 300 by traversing the isolated portion 330a of the via 330. Similarly, the isolated portion 330b of the via 330 allows another electrical signal 362 to transmit to trace 380 without interfering with the signal 360.

Plating resist is a generally nonconductive material deposited in one or more clearances of conducting and dielectric layers. For example, in FIG. 3, plating resist is deposited in a clearance in the conducting layer 310d. When PCB 300 is placed in a seed or catalyzing bath, the seed will deposit on all areas of the via wall but will not deposit on the plating resist. Should small amounts of seed be deposited on the plating resist, a post processing operation can be utilized to remove these residual deposits. Subsequently, when the panel is placed into an electroless copper or electrolytic copper plating bath, copper will plate where there is seed or conductivity and will not plate or deposit in the area where there is plating resist. The plating resist will form a cylindrical void that effectively partitions the barrel of the via into segments.

The plating resist 370 prevents the deposition of the catalyzing material 390 and conductive material 392 within the via structure 330 at the conducting layer 310d. As a result, via 330 is partitioned into the electrically isolated portions 330a, and 330b. Consequently, the electric signal 360 travels from the first conducting layer 310a to the second conducting layer 310b without signal integrity being degraded through interference caused by section 330b. The conductive material 392 of the plated via structure 330 is the medium through which the electrical signal 360 travels from the first conducting layer 310a of the PCB 300 to the second conducting layer 310b. Similarly, electric signal 362 traverses plated via 330 conductive layer 310e. The plated via structure 330 may be of any shape.

Some examples of the conductive or catalytic material 390 are electroless copper, palladium seed. The catalytic seeding process can also include electrophoretic plating, or direct metallization. The plating process wherein the conductive material 392 such as conductive metal, or copper is deposited within the via structure 330 may comprise electrolytic plating, or an electroless process.

The PCB 300 can have any number of conducting layers and dielectric layers. FIG. 3 only shows five layers of conducting layers 310a-310e and five layers of dielectric layers 320a-320e for the sake of simplicity. Each of the conducting layers 310a-310e may comprise a partial or full layer such as a power or ground layer, may comprise a layer of circuit traces, or may comprise a layer with both circuit traces and a partial layer such as a ground layer. A non-limiting example of the conducting layers 310a-310e is copper. Some non-limiting examples of dielectric layers 320a-320e are FR-4, epoxy glass, polyimide glass, ceramic hydrocarbon, polyimide film, resin impregnated woven glass, film, resin impregnated matte material, Kevlar, paper, and resin dielectrics with dispersed nano-powders. According to certain embodiments, the partitioned via is filled with an insulating or resistive paste to improve reliability or functionality.

A method of partitioning a plated via such as plated via 330 is described herein with reference to FIGS. 4 to 8. As described further herein, a clearance is a hole that is within at least one conducting layer 310a-310e and/or at least one dielectric layer 320a-320e. For example, a clearance may be formed in the conducting layer 310e. Each clearance has a radius greater than the plated via structure 330. The formation of the clearances through an etching process is described below with reference to FIGS. 4-8.

FIGS. 4-8 are examples depicting etching a clearance within the conducting layer 310d, as well as the placement and deposition of the plating resist 370, according to certain embodiments of the invention. It is to be noted that the etching as described with reference to FIGS. 4-8 would apply to both conductive layers of the sub-composite structure. For purposes of simplicity, the etching is described with reference to one conductive layer (310d) of FIG. 4-8. Further, for simplicity, FIGS. 4-8 describes the selective deposition of plating resist on one location in a core sub-composite structure. However, it is understood that plating resist can be selectively deposited on multiple locations in the sub-composite structure depending on the PCB design. Moreover, each sub-composite structure may have the plating resist selectively deposited on different layers than that of other sub-composite structures so as to achieve the desired PCB design by laminating these various sub-composite structures to form the PCB stackup.

Figure 4:
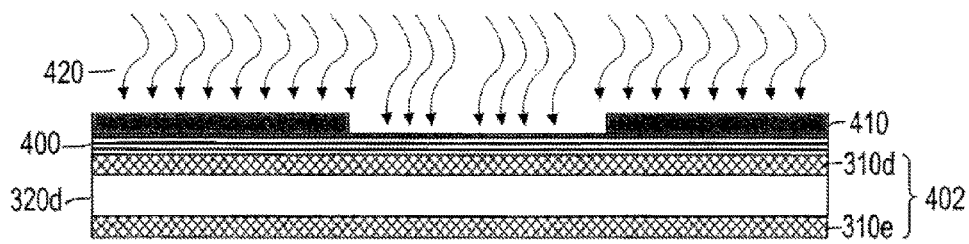
FIG. 4 is an illustration depicting a core sub-composite structure covered with a layer of etch resist that is selectively exposed to electromagnetic radiation, according to certain embodiments.

FIG. 4 is an illustration depicting a core sub-composite structure covered with a layer of etch resist that is selectively exposed to electromagnetic radiation, according to certain embodiments. FIG. 4 shows sub-composite structure 402 (also referred to herein as a core) that includes a dielectric layer 320d sandwiched between two conducting layers 310d, and 310e. Conductive layer 310d is covered with an etch resist 400. Portions of the etch resist is covered with a mask 410.

The etch resist 400 is any material that is applied to an area of the conducting layer 310d to prevent reaction of that area during an electromagnetic, chemical, or electrochemical etching process. The etch resist 400 may be processed by a lithographic process, by selective deposition, or by direct laser imaging. Some examples of etch resist 400 are photoresist, organic material, dry film, sheet, paste, polymer thick film, and liquid.

Mask 410 is a film or plate that selectively covers an area to prevent reaction of the covered area during the electromagnetic, chemical, or electrochemical reaction. Some examples of the mask 410 are silver film, glass, or diazo film. Mask 410 may be positioned over the etch resist 400 with a mask aligner (not depicted) which is configured to control the placement of the mask 410. The exposed portion of the etch resist 400 is exposed to electromagnetic radiation 420, or a laser, as non-limiting examples, and altered to make the exposed etch resist removable while leaving the covered etch resist undisturbed. In the case of using a laser, mask 410 is not needed.

Figure 5:
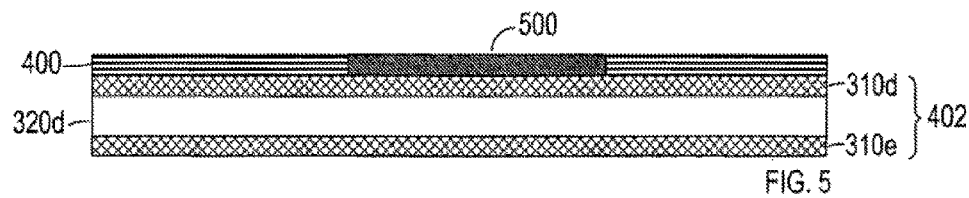
FIG. 5 is an illustration depicting the conducting layers and the dielectric layer of sub-composite structure with an area of altered etch resist, according to certain embodiments of the invention.

FIG. 5 is an illustration depicting the conducting layers 310d, 310e and the dielectric layer 320d of sub-composite structure 402 with an area of altered etch resist 500, according to certain embodiments of the invention. The electromagnetic radiation 420 (FIG. 4) has been terminated and the mask 410 (FIG. 4) has been removed thereby exposing the unaltered etch resist 400.

Figure 6:
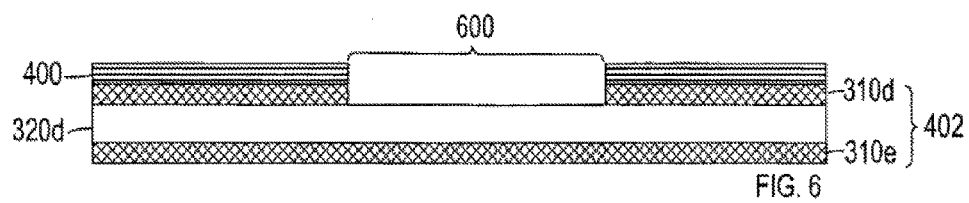
FIG. 6 is an illustration depicting the conducting layers and the dielectric layer of a sub-composite structure with the altered etch resist and a portion of the conducting layer removed to form a clearance in the conductive layer, according to certain embodiments.

FIG. 6 is an illustration depicting the conducting layers 310d, 310e and the dielectric layer 320b of sub-composite structure 402 with the altered etch resist 500 (FIG. 5) and a portion of the conducting layer 310d removed to form a clearance 600 in the conducting layer 310d, according to certain embodiments. The altered etch resist 500 (FIG. 5) has been removed by methods well known in the art thereby exposing a portion of the conducting layer 310d. The exposed portion of the conducting layer 310d is then etched to form the clearance 600 and expose the dielectric layer 320d. Clearance 600 can be in a ground or power plane or in conductive pad or feature on a signal layer.

Figure 7:
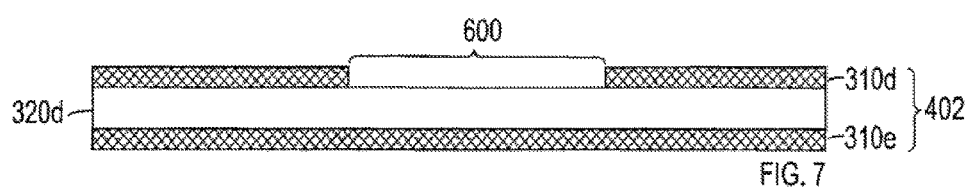
FIG. 7 is an illustration depicting the conducting layers and the dielectric layer of sub-composite structure with the unaltered etch resist removed, according to certain embodiments.

FIG. 7 is an illustration depicting the conducting layers 310d, 310e and the dielectric layer 320d of sub-composite structure 402 with the unaltered etch resist 400 removed, according to certain embodiments. The unaltered etch resist 400 (FIGS. 4-6) may be removed by methods well known in the art, thereby exposing the conducting layer 310d.

Figure 8:
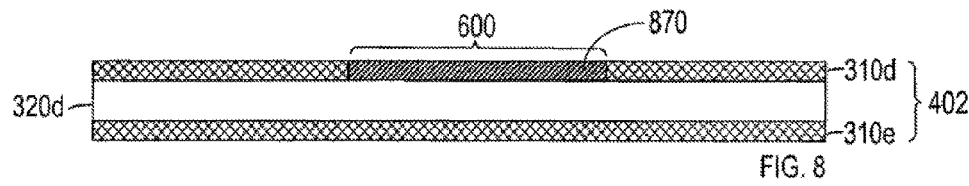
FIG. 8 is an illustration depicting the conducting layers and the dielectric layer of a sub-composite structure with the plating resist deposited within the clearance, according to certain embodiments.

FIG. 8 is an illustration depicting the conducting layers 310d, 310e and the dielectric layer 320d of sub-composite structure 402 with the plating resist 870 deposited within the clearance 600, according to certain embodiments.

For example, a plating resist can be deposited into a clearance using printing, stencil printing, needle dispensing, etc. The plating resist can be a hydrophobic insulating material that is resistant to the deposition of a catalytic species capable of catalyzing an electroless metal deposition. The plating resist can also be a material that resists deposition of other "seed" deposits such as colloidal graphite.

The plating resist can be deposited so as to be flush or higher than the etched clearance layer. The plating resist can be a paste or viscous liquid. Some non-limiting examples of plating resists are silicone resins, polyethylene resins, fluorocarbon resins, polyurethane resins, and acrylic resins. Such insulating hydrophobic resinous material can be used alone or in a combined composition with other resinous materials in amounts sufficient to maintain hydrophobic properties in the combined composition.

After depositing the plating resist, the plating resist is cured using appropriate methods. The sub-composite structure 402 with plating resist 870 in place can now be laminated to the rest of the multilayer PCB stackup using techniques well known in the art. Multiple sub-composite structures (cores) with selectively deposited plating resist areas in varying locations can be laminated to form a PCB stackup. Through-holes are drilled through the PCB stackup through conductive layers, dielectric layers and through the plating resist.

Thus, the PCB panel has multiple through-holes that can then be plated simultaneously by placing the panel into a seed bath, followed by immersion in an electroless copper bath. A non-limiting example of a seed bath is copper palladium colloid. An example for surface plating can be found in U.S. Pat. No. 4,668,532. The electroless copper provides the initial conductivity path to allow for additional electrolytic copper plating of the barrel of each through-hole in the panel. The seed chemistry (electroless copper) will deposit on the surface of the through-hole wall, but will not deposit effectively on areas of the wall with the plating resist. A small amount of electroless copper may deposit on the plating resist but such an amount can be removed with a post processing step known in the art. For example, any small amounts of electroless copper that may be deposited on the plating resist can be removed by contacting the affected areas with a chelating agent in an alkaline solution for a time period sufficient to remove essentially all of said catalytic species from the hydrophobic plating resist. The panel will then follow known processes either for panel plating or pattern plating. For example, electrolytic or electroless plating can be used. In other words, the interior walls of the through-holes are contacted with a metal deposition solution to metallize only the exposed catalytic areas of the walls not protected by the hydrophobic plating resist.

Plating of conductive material in the via structure will build wherever there is seed material. Similarly, no plating of conductive material will form where there is plating resist. Thus, the areas that are void of plated conductive material in the via structure effectively partition the via into electrically isolated sections. By strategically placing plating resist in certain locations and on certain layers of a PCB stackup, multiple electrically isolated portions in via structures can be formed, simultaneously.

Thus, the above method can be used to configure the via structure into multiple electrically isolated segments. Each such segment provides interconnect paths to appropriate layers within the PCB. Such partitioned vias can be subsequently filled with an insulating material like epoxy or other insulating or resistive polymer for improved reliability or increased functionality. Therefore, costly, error prone, and time intensive backdrilling may be avoided. Similarly, referring back to FIG. 3. the use of the plating resist 370 avoids possible damage to the PCB 300 which may result by backdrilling. A further advantage is that, whereas backdrilling is typically controllable to a depth tolerance of +/−5 mils, a controllable depth tolerance of +/−1 mils or better may be achieved by the systems and methods described herein. As a result, the consistency between the plating resist 370, the dielectric layers 320b, and the conducting layer 310c may be held to a tighter standard deviation as compared to backdrilling.

According to certain embodiments, a thicker resist deposit may be preferred. In such a case, the sub-composite structure or core is mechanically drilled with through-holes corresponding to areas where partitioned via structures are desired in the resulting PCB stackup. The thickness of the sub-composite structure can range from about 1-50 mils. Thus, a thicker deposit of plating resist can be produced. The through-holes are filled with plating resist using specialized hole filling equipment, stenciling or screen printing. Such a process is known as hole-plugging or via-filling. The plating resist is then cured using an appropriate process. A planarizing or scrubbing operation may be employed to remove any excess plating resist from the surface of the sub-composite structure. The sub-composite structure can be processed using standard PCB procedures to form circuit images. It is to be noted that the through-holes can be filled with plating resist before or after forming circuit images. The sub-composite structure can then be laminated into a multilayer PCB stackup and the process can continue as described above for electroless seeding and subsequent plating of the interior walls of the one or more via structures in the PCB stackup. According to certain embodiments, the partitioned via is filled with an electrically insulating material, ohmically resistive paste or voltage switchable dielectric material to improve reliability or functionality. In the case of using voltage switchable dielectric material, programmable circuit routing in PCBs can be made. Further, the voltage switchable dielectric material can provide transient protection. The term "transient" as used herein encompasses not only electrostatic discharge events but any phenomena, of short duration, that directly or indirectly induces voltages and currents into a printed circuit board and where the amplitudes of such voltages and currents are high enough to cause degradation or failure of the electronic components on the printed circuit board.

Figure 9:
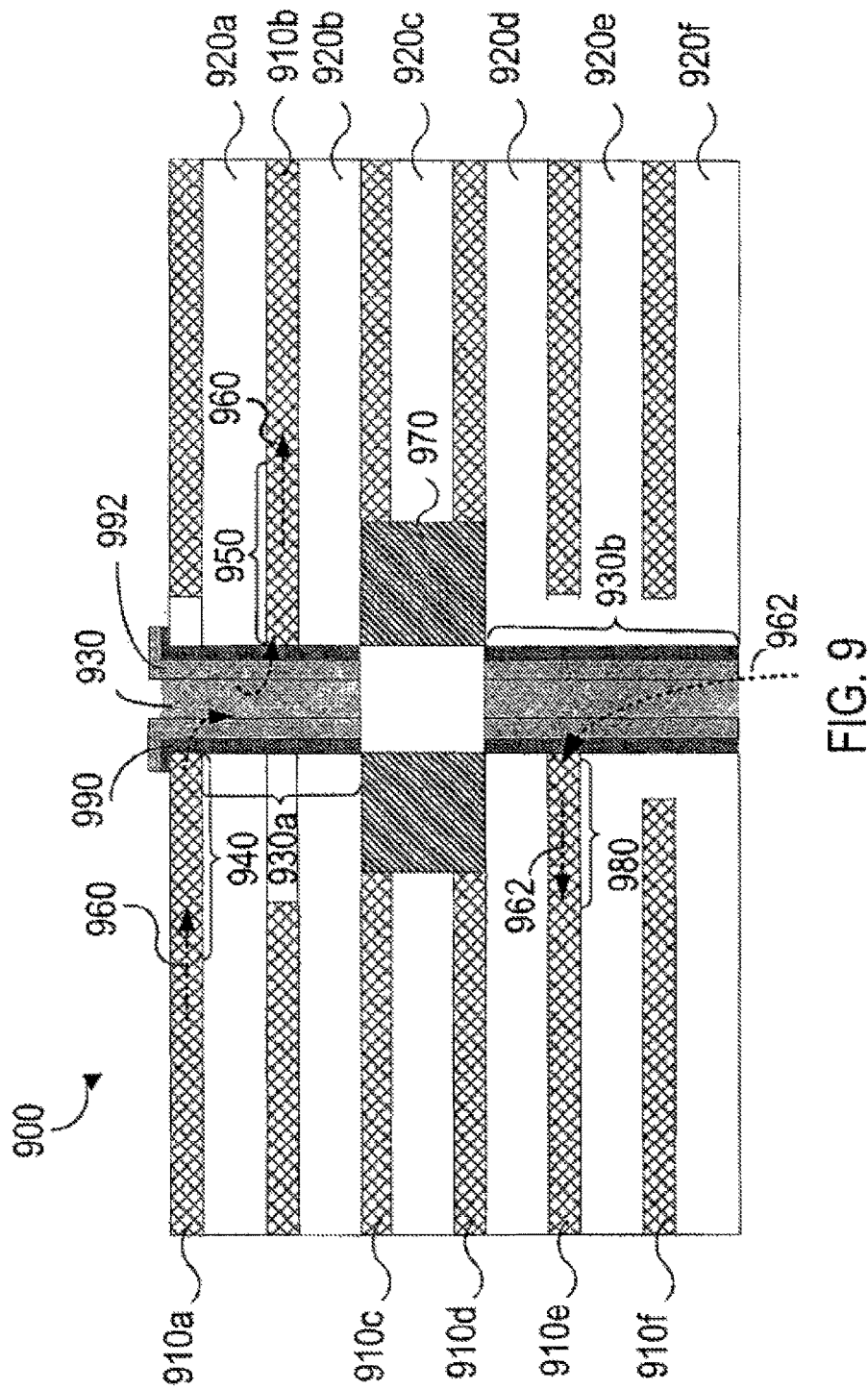
FIG. 9 is an illustration depicting a PCB stackup with a partitioned plated via structure formed using a thicker layer of plating resist, according to certain embodiments.

FIG. 9 is an illustration depicting a PCB stackup with a partitioned plated via structure formed using a thicker layer of plating resist, according to certain embodiments. FIG. 9 shows a PCB 900 that includes conducting layers 910a-910f separated by dielectric layers 920a-920f. The plated via structure 930 is plated with a seed conductive material 990 and a further coating of conductive material 992. The plated via 930 is effectively partitioned into a plurality of electrically isolated portions (930a, and 930b) by selectively depositing plating resist in a sub-composite structure used for making the PCB stackup.

FIG. 9 shows that the partitioned plated via allows an electrical signal 960 to transmit from one trace 940 on a first conducting layer 910a to another trace 950 on a second conducting layer 910b of the PCB 900 by traversing the isolated portion 930a of the via 930 without signal integrity being degraded through interference caused by portion 930b. The conductive material 992 of the plated via structure 930 is the medium through which the electrical signal 960 travels from the first conducting layer 910a of the PCB 900 to the second conducting layer 910b. Similarly, the isolated portion 930b of the via 930 allows another electrical signal 962 to transmit to trace 980 without interfering with the signal 960. The plating resist 970 prevents the deposition of the conductive material 990 and 992 within the via structure 930 at the conducting layers 910c and 910d. As a result, via 930 is effectively partitioned into the electrically isolated portions 930a, and 930b.

The PCB 900 can have any number of conducting layers and dielectric layers. FIG. 9 only shows six layers of conducting layers 910a-910f and six layers of dielectric layers 920a-920f for the sake of simplicity. Each of the conducting layers 910a-910f may comprise a partial or full layer such as a power or ground layer, and may comprise a layer of circuit traces, or may comprise a layer with both circuit traces and a partial layer such as a ground layer. A non-limiting example of the conducting layers 910a-910f is copper and some non-limiting examples of dielectric layers 920a-920f are epoxy glass, polyimide glass, ceramic hydrocarbon, polyimide film, Teflon film, resin impregnated matte material, Kevlar, paper, resin dielectrics with dispersed nano-powders.

According to certain embodiments, plating resist is selectively deposited in a clearance formed in a conducting layer and an adjacent dielectric layer of a sub-composite structure. In such a case, the sub-composite structure can be mechanically or laser drilled to form a blind hole. The blind hole starts at one conductive layer of the sub-composite structure, proceeds through the dielectric layer and terminates on another conductive layer of the sub-composite structure. However, the depth of the blind hole can be drilled to any depth short of reaching the conductive layer of the sub-composite structure. Plating resist is then deposited into the blind hole using a squeegeeing, stenciling, or screen printing operation, for example. The resist is then cured. A planarizing or scrubbing operation may be employed to remove resist from the open end of the blind hole. The sub-composite structure can be processed using standard PCB procedures to form circuit images. It is to be noted that the plating resist can be deposited before or after forming circuit images. The sub-composite structure can then be laminated into a multilayer PCB stackup and the process can continue as described above for electroless seeding and subsequent plating of the interior walls of the via structure. The advantage in such a via structure is that the plating resist does not come out of the blind end of the hole and a connection can be made to the undrilled conductive layer of the sub-composite structure (core). According to certain embodiments, the partitioned via is filled with an electrically insulating material, ohmically resistive paste or voltage switchable dielectric material to improve reliability or functionality. In the case of using voltage switchable dielectric material, programmable circuit routing in PCBs can be made. Further, the voltage switchable dielectric material can provide transient protection.

Figure 10:
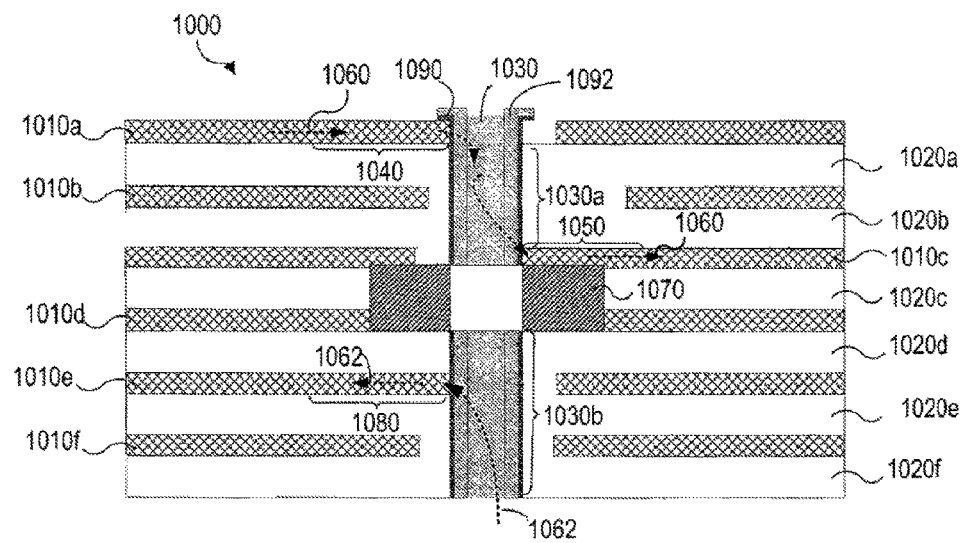
FIG. 10 is an illustration depicting a PCB stackup with a partitioned plated via structure formed by selectively depositing plating resist in a clearance formed in a conducting layer and an adjacent dielectric layer of a sub-composite structure, according to certain embodiments.

FIG. 10 is an illustration depicting a PCB stackup with a partitioned plated via structure formed by selectively depositing plating resist in a clearance formed in a conducting layer and an adjacent dielectric layer of a sub-composite structure, according to certain embodiments. FIG. 10 shows a PCB 1000 that includes conducting layers 1010a-1010f separated by dielectric layers 1020a-1020f. The plated via structure 1030 is plated with a seed conductive material 1090 and a further coating of conductive material 1092. The plated via 1030 is effectively partitioned into a plurality of electrically isolated portions (1030a, and 1030b) by selectively depositing plating resist in a sub-composite structure used for making the PCB stackup.

FIG. 10 shows that the partitioned plated via allows an electrical signal 1060 to transmit from one trace 1040 on a first conducting layer 1010a to another trace 1050 on a different conducting layer 1010c of the PCB 1000 by traversing the isolated portion 1030a of the via 1030 without signal integrity being degraded through interference caused by portion 1030b. The conductive material 1092 of the plated via structure 1030 is the medium through which the electrical signal 1060 travels from the first conducting layer 1010a of the PCB 1000 to the another conducting layer 1010c. Similarly, the isolated portion 1030b of the via 1030 allows another electrical signal 1062 to transmit to trace 1080 without interfering with the signal 1060. The plating resist 1070 prevents the deposition of the conductive material 1090 and 1092 within the via structure 1030 at the conducting layer 1010d and the dielectric layer 1020c. As a result, via 1030 is effectively partitioned into the electrically isolated portions 1030a, and 1030b.

The PCB 1000 can have any number of conducting layers and dielectric layers. FIG. 10 only shows six layers of conducting layers 1010a-1010f and six layers of dielectric layers 1020a-1020f for the sake of simplicity. Each of the conducting layers 1010a-1010f may comprise a partial or full layer such as a power or ground layer, and may comprise a layer of circuit traces, or may comprise a layer with both circuit traces and a partial layer such as a ground layer. A non-limiting example of the conducting layers 1010a-1010f is copper and some non-limiting examples of dielectric layers 1020a-1020f are epoxy glass, polyimide glass, ceramic hydrocarbon, polyimide film, Teflon film, resin impregnated matte material, Kevlar, paper, resin dielectrics with dispersed nano-powders.

According to certain embodiments, plating resist is selectively deposited on the surface of a sub-composite structure on the exposed dielectric on the surface that is coplanar with the top conducting layer of the sub-composite structure. In such a case, the plating resist is deposited onto an etched surface of a sub-composite core on the exposed dielectric. The plating resist is deposited onto the dielectric using screen printing, stenciling, needle depositing or other methods know in the art. The thickness of the deposit of plating resist can be adjusted to a range up to 5 mils thick. The deposit of plating resist can be any shape but typically would be round or square in geometry. After deposition, the resist is cured using appropriate process. The sub-composite structure can be processed using standard PCB procedures to form circuit images. It is to be noted that the plating resist can be deposited before or after forming circuit images. The sub-composite structure can then be laminated into a multilayer PCB stackup and the process can continue as described above for electroless seeding and subsequent plating of the interior walls of the via structure. According to certain embodiments, the partitioned via is filled with an electrically insulating material, ohmically resistive paste or voltage switchable dielectric material to improve reliability or functionality. In the case of using voltage switchable dielectric material, programmable circuit routing in PCBs can be made. Further, the voltage switchable dielectric material can provide transient protection.

Figure 11:
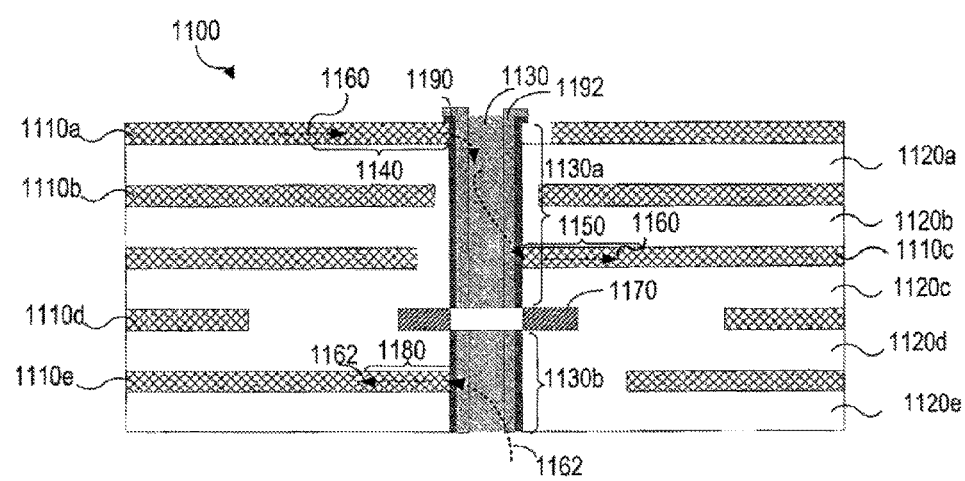
FIG. 11 is an illustration depicting a PCB stackup with a partitioned plated via structure formed by selectively depositing plating resist on the surface of a sub-composite structure on an anti-pad region of the surface that is coplanar with the top conducting layer of the sub-composite structure, according to certain embodiments.

FIG. 11 is an illustration depicting a PCB stackup with a partitioned plated via structure formed by selectively depositing plating resist on the surface of a sub-composite structure on the exposed dielectric, according to certain embodiments. FIG. 11 shows a PCB 1100 that includes conducting layers 1110a-1110e separated by dielectric layers 1120a-1120e. The plated via structure 1130 is plated with a seed conductive material 1190 and a further coating of conductive material 1192. The plated via 1130 is effectively partitioned into a plurality of electrically isolated portions (1130a, and 1130b) by selectively depositing plating resist in a sub-composite structure used for making the PCB stackup.

FIG. 11 shows that the partitioned plated via allows an electrical signal 1160 to transmit from one trace 1140 on a first conducting layer 1110a to another trace 1150 on a different conducting layer 1110c of the PCB 1100 by traversing the isolated portion 1130a of the via 1130 without signal integrity being degraded through interference caused by portion 1130b. The conductive material 1192 of the plated via structure 1130 is the medium through which the electrical signal 1160 travels from the first conducting layer 1110a of the PCB 1100 to the another conducting layer 1110c. Similarly, the isolated portion 1130b of the via 1130 allows another electrical signal 1162 to transmit to trace 1180 without interfering with the signal 1160. The plating resist 1170 prevents the deposition of the conductive material 1190 and 1192 within the via structure 1130 at an area between the conducting layer 1110c and another conductive layer 1110e. As a result, via 1130 is effectively partitioned into the electrically isolated portions 1130a, and 1130b. The plated via structure 1130 may be of any shape.

The PCB 1100 can have any number of conducting layers and dielectric layers. FIG. 11 only shows five layers of conducting layers 1110a-1110e and five layers of dielectric layers 1120a-1120e for the sake of simplicity. Each of the conducting layers 1110a-1110e may comprise a partial or full layer such as a power or ground layer, and may comprise a layer of circuit traces, or may comprise a layer with both circuit traces and a partial layer such as a ground layer. A non-limiting example of the conducting layers 1110a-1110e is copper and some non-limiting examples of dielectric layers 1120a-1120e are epoxy glass, polyimide glass, ceramic hydrocarbon, polyimide film, Teflon film, resin impregnated matte material, Kevlar, paper, resin dielectrics with dispersed nano-powders.

According to certain embodiments, plating resist is selectively deposited on the surface of a sub-composite structure on a conductive region or conductive pad on the surface of the sub-composite structure. The conductive region could be patterned to be a plane or could be an individual pad or feature. In the case of a pad or feature, the plating resist may overlap the pad. The plating resist is deposited onto the conductive region using screen printing, stenciling, needle depositing or other methods know in the art. The deposit of plating resist can be any shape but typically would be round or square in geometry. After deposition, the resist is cured using appropriate process. The sub-composite structure can be processed using standard PCB procedures to form circuit images. It is to be noted that the plating resist can be deposited before or after forming circuit images. The sub-composite structure can then be laminated into a multilayer PCB stackup and the process can continue as described above for electroless seeding and subsequent plating of the interior walls of the via structure. According to certain embodiments, the partitioned via is filled with an electrically insulating material, ohmically resistive paste or voltage switchable dielectric material to improve reliability or functionality. In the case of using voltage switchable dielectric material, programmable circuit routing in PCBs can be made. Further, the voltage switchable dielectric material can provide transient protection.

Figure 12:
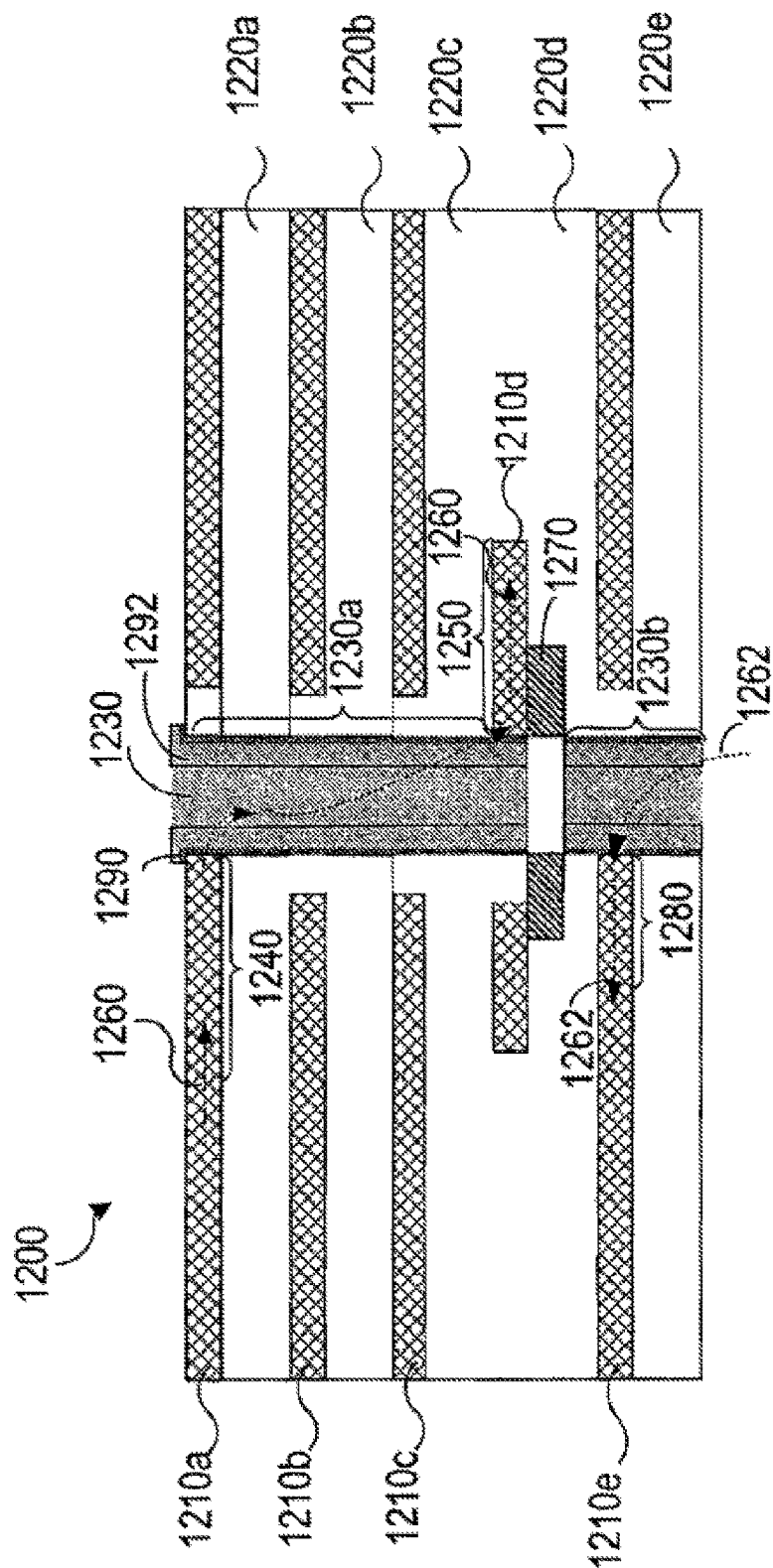
FIG. 12 is an illustration depicting a PCB stackup with a partitioned plated via structure formed by selectively depositing plating resist on a conductive region or conductive pad on the surface of the sub-composite structure, according to certain embodiments.

FIG. 12 is an illustration depicting a PCB stackup with a partitioned plated via structure formed by selectively depositing plating resist on a conductive region or conductive pad on the surface of the sub-composite structure, according to certain embodiments. FIG. 12 shows a PCB 1200 that includes conducting layers 1210a-1210e separated by dielectric layers 1220a-1220e. The plated via structure 1230 is plated with a seed conductive material 1290 and a further coating of conductive material 1292. The plated via 1230 is effectively partitioned into a plurality of electrically isolated portions (1230a, and 1230b) by selectively depositing plating resist in a sub-composite structure used for making the PCB stackup.

FIG. 12 shows that the partitioned plated via allows an electrical signal 1260 to transmit from one trace 1240 on a first conducting layer 1210a to another trace 1250 on the conducting pad 1210d of the PCB 1200 by traversing the isolated portion 1230a of the via 1230 without signal integrity being degraded through interference caused by portion 1230b. The conductive material 1292 of the plated via structure 1230 is the medium through which the electrical signal 1260 travels from the first conducting layer 1210a of the PCB 1200 to the conducting pad 1210d. Similarly, the isolated portion 1230b of the via 1230 allows another electrical signal 1262 to transmit to trace 1280 without interfering with the signal 1260. The plating resist 1270 prevents the deposition of the conductive material 1290 and 1292 within the via structure 1230 at an area between the conducting layer 1210e and the conducting pad 1210d. As a result, via 1230 is effectively partitioned into the electrically isolated portions 1230a, and 1230b. The plated via structure 1230 may be of any shape.

The PCB 1200 can have any number of conducting layers and dielectric layers. FIG. 12 only shows five layers of conducting layers 1210a-1210e and five layers of dielectric layers 1120a-1120e for the sake of simplicity. Each of the conducting layers 1210a-1210e may comprise a partial or full layer such as a power or ground layer, and may comprise a layer of circuit traces, or may comprise a layer with both circuit traces and a partial layer such as a ground layer. A non-limiting example of the conducting layers 1210a-1210f is copper and some non-limiting examples of dielectric layers 1220a-1220e are epoxy glass, polyimide glass, ceramic hydrocarbon, polyimide film, Teflon film, resin impregnated matte material, Kevlar, paper, resin dielectrics with dispersed nano-powders.

Due to the selective nature of the plating resist deposition and simultaneous plating of the vias resulting in partitioned sections, vias can be subdivided into multiple sections each capable of carrying signals without disturbing signals in other sections. To do so effectively, a computer program is advantageous to use when designing a PCB layout. For example, the computer program would be patched to an ECAD software such as Cadence Allegro™ or Mentor Expedition™ or Supermax™. The computer program can also run as a stand alone software module, which would import data from an ECAD system, partition the vias, then output appropriate files back to the ECAD or Computer Aided Manufacturing (CAM) system. Such software can also output files to be used for programming manufacturing equipment to drill appropriate holes in selected cores and/or generate art work to manufacture stencils for selective deposition of the plating resist. Thus, by determining the locations of the plating resist and location of the resulting partitioned vias, a PCB design can be optimized to increase routing density and improve integrity. In the case of a pre-existing design of a PCB layout, the computer program can be used to identify locations for selective depositions of plating resist in locations that correlate to locations for backdrilling, for example.

Wider Conductive Via Gaps Using Multiple Plating Resist Points

One shortcoming of some single plating resist gap/void approaches, like in FIG. 3, is that they are prone manufacturing defects (e.g., electrical shorting). For example, as the layers in a multilayer PCB stackup get thinner, the thickness of the plating resist must also get thinner, increasing the probability that the conductive plating material in a plated through hole (also referred to as a via) can short across the plating resist material intended to case the gap/void.

Figure 13:
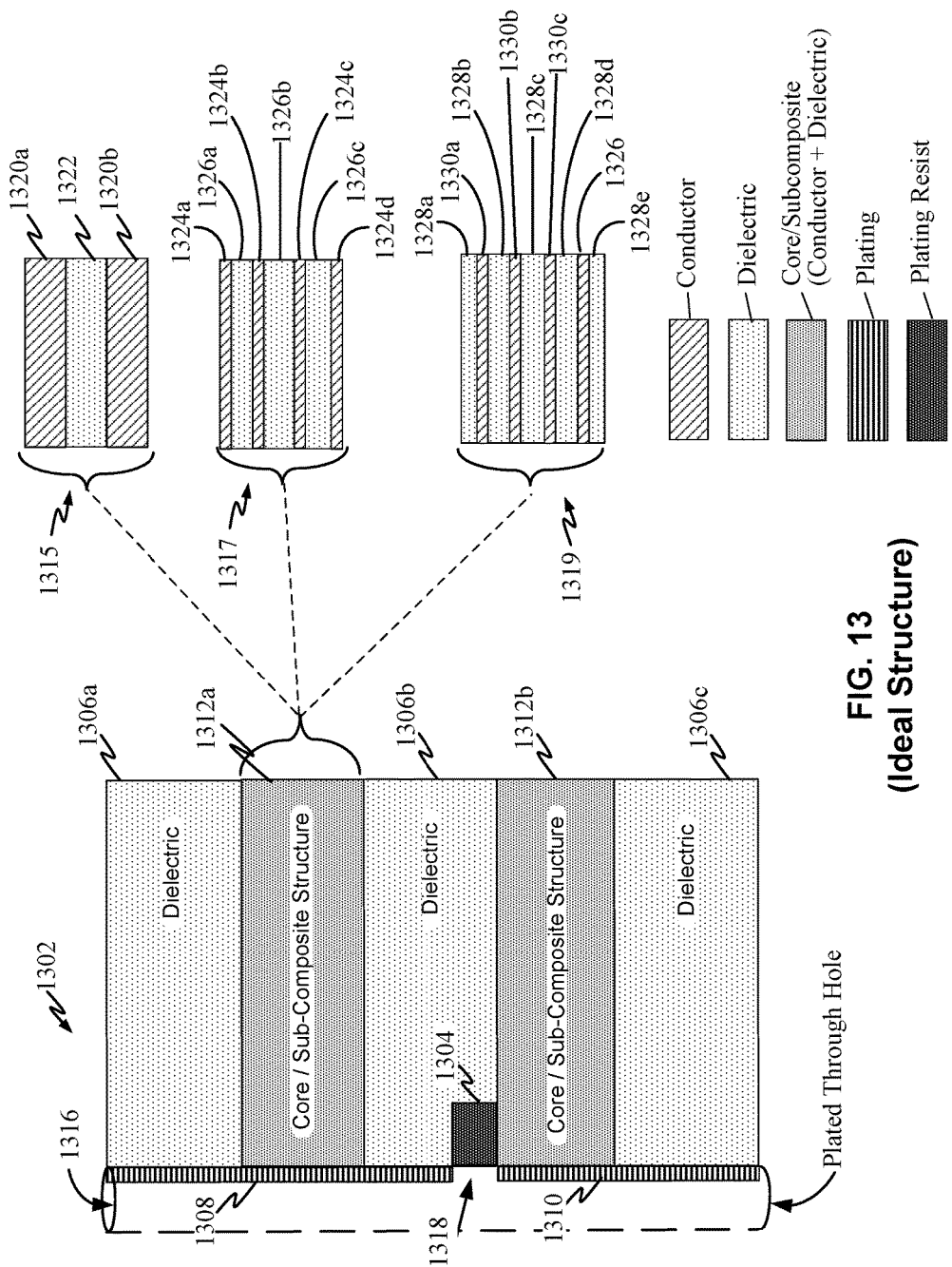
FIG. 13 illustrates a cross-sectional view of a portion of a multilayer PCB stackup having an ideal gap formed within a plated through hole (PTH).

FIG. 13 illustrates a cross-sectional view of a portion of a multilayer PCB stackup having an ideal gap formed within a plated through hole (PTH). The multilayer PCB stackup 1302 may include one or more core and/or sub-composite structures 1312a and 1312b that are laminated together to form the PCB stackup 1302. Each core and/or sub-composite structure 1312a and 1312b may include one or more dielectric layers and/or one or more conductive layers that form a rigid, semi-rigid, semi-flexible, and/or flexible structure.

In one example, the structures 1312a and/or 1312b may be a core structure 1315 (e.g., flexible, semi-flexible/semi-rigid, or rigid) that include conductive layers (e.g., foils) 1320a and 1320b with a dielectric material 1322 (e.g., prepreg) on one or both sides. The dielectric material may be, for example, a prepreg, a bonding sheet, and/or sub-composite materials such as cured or partially cured resin and these may be impregnated with a reinforcement or reinforcing material or aggregate. Cured or partially cured resin may include epoxy, polyimide, polyphenylene ether (PPO), cyanate ester, hydrocarbon, polytetrafluoroethylene (PTFE), bismaleimide triazine (BT), phenol resin or any resin that is used for printed circuit board dielectric material as a pure or blended composition. Resin impregnated reinforcement may be used for the dielectric material 1322 and may include woven or unwoven glass fibers, Kevlar fibers, polyester fiber, carbon fiber, cellulose fiber or any other fiber that are used for printed circuit board. When unwoven reinforcement is used, this reinforcement may be fibers as chopped, powdered material, etc.

In a second example, the structures 1312a and/or 1312b may be a first sub-composite structure 1317 (e.g., flexible, semi-flexible/semi-rigid, or rigid) that includes one or more conductive layers (e.g., foils) 1324*a*, 1324*b*, 1324*c*, and/or 1324*d*, with one or more dielectric layers 1326*a*, 1326*b*, and/or 1326*c* in between. In this example, the composite structure 1317 has conductive layers on the top and bottom surfaces.

In a third example, the structures 1312*a* and/or 1312*b* may be a second sub-composite structure 1319 (e.g., flexible, semi-flexible/semi-rigid, or rigid) that includes one or more dielectric layers 1328*a*, 1328*b*, 1328*c*, 1328*d*, and/or 1328*e* with one or more conductive layers (e.g., foils) 1330*a*, 1330*b*, 1330*c*, and/or 1330*d* in between. In this example, the composite structure 1319 has dielectric layers on the top and bottom surfaces.

In some examples, one or more of the conductive layers within the core/sub-composite structures 1312*a* and/or 1312*b* may include electrical traces and/or pads that may have been formed by etching of the conductive layers 1320, 1324, and/or 1330.

In FIG. 13, plating resist 1304 has been deposited on a portion of the core/sub-composite structure 1312*b*. For instance, during the stacking process, the plating resist 1304 may have been deposited on a surface of the core/sub-composite structure 1312*b* using, for example, screen printing, stencil printing, ink jet, transfer printing or other deposition method. Note that the plating resist 1304 may be deposited on top of either a conductive layer 1320*a*, 1324*a* or a dielectric layer 1328*a*.

A plated through-hole (PTH) 1316 may be formed through the stackup 1302 including plating resist 1304 which may electrically couple one or more conductive layers 1320, 1324, and/or 1330 of the core/sub-composite structures 1312*a*, 1312*b* and/or electrical traces/pads formed on one or more of the conductive layers. The plating resist 1304 prevents the deposition of the conductive plating material within the PTH 1316 at the plating resist 1304. As a result, the PTH 1316 is effectively partitioned into the electrically isolated via segments 1308 and 1310. When the PTH 1316 is plated with an electrically conductive material, the two separate via segments 1308 and 1310 are formed, with a via gap/void/clearance 1318 being formed by the plating resist 1304.

However, FIG. 13 is an ideal situation, and does not illustrate the problems often exhibited in real/practical PTH structures.

Figure 14:
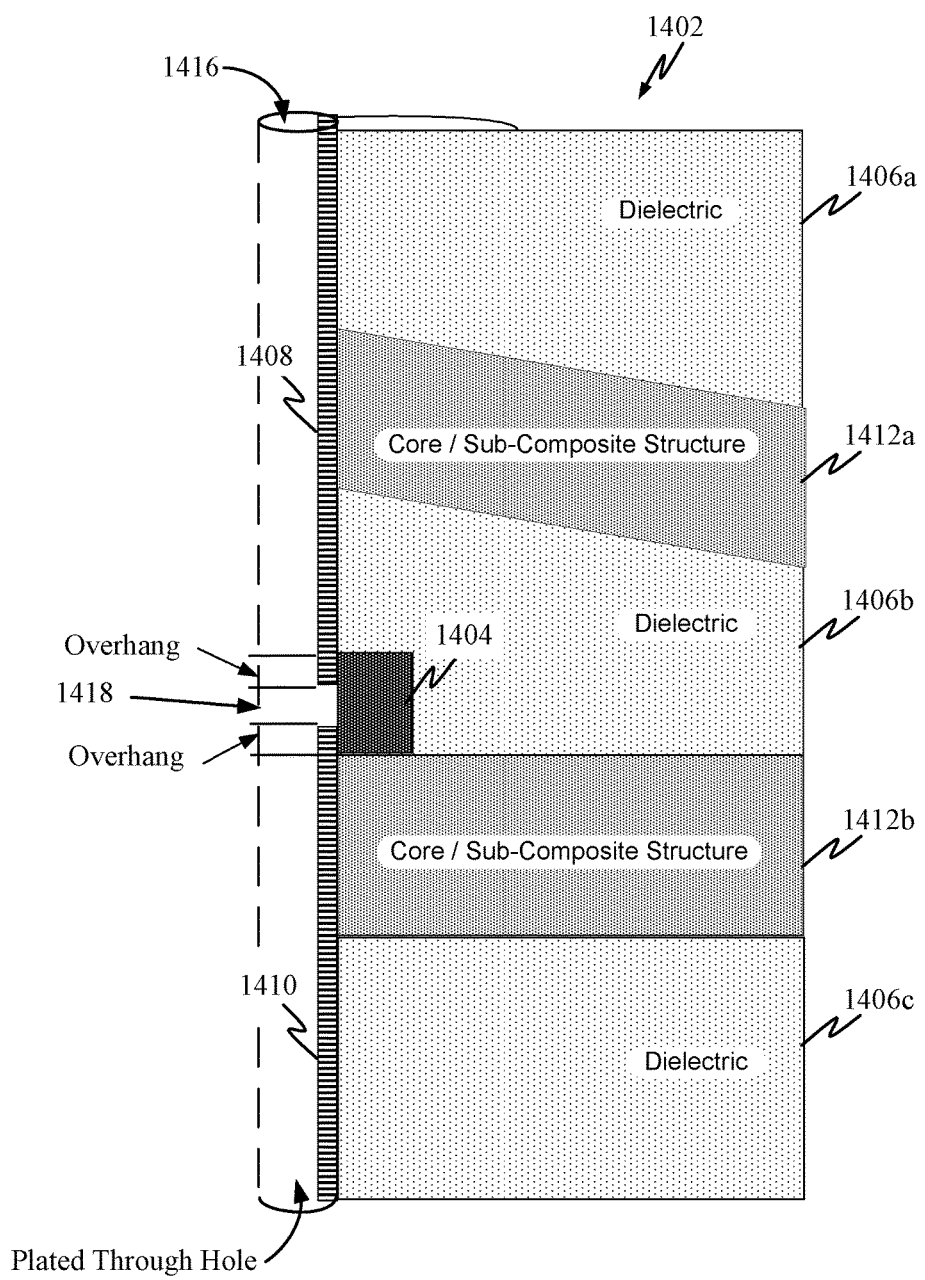
FIG. 14 illustrates a cross-sectional view of a portion of a practical multilayer PCB stackup having a gap formed within a plated through hole (PTH).

FIG. 14 illustrates a cross-sectional view of a portion of a practical multilayer PCB stackup having a gap formed within a plated through hole (PTH) 1416. The multilayer PCB stackup 1402 includes a plurality of dielectric layers 1406*a*, 1406*b*, and 1406*c* (e.g., prepreg layers) and a plurality of core or sub-composite structures 1412*a* and 1412*b*. The core or sub-composite structures 1412*a* and 1412*b* may be similar to those of FIG. 13. In this example, plating resist 1404 has been deposited on a first core/sub-composite structure 1412*b*. When the PTH 1416 is plated with an electrically conductive material, two separate via segments 1408 and 1410 are formed, with a via gap/void/clearance 1418 being formed by the plating resist 1404. As illustrated here, there may be a wide thickness variance (e.g., between layers 1412*a* and 1406*b*) due to uneven solid structure in 1406*b* during the lamination process. Thus, at least one non-conductive/dielectric layer 1406*b* may need to be sufficiently wide to accommodate thickness variances and lamination void concerns when multiple core or sub-composite structures 1412*a* and 1412*b* are laminated together. In the meantime, many printed circuit boards (PCB) have dielectric layer thickness constraints due to impedance control, total thickness control and/or the other reasons. Then the PCB may face an unsolvable trade off. For instance, there is often over hang conductive plating material extending over the plating resist 1404 due to isotropic electrolyte plating nature. This overhang conductive material shortens the width of the gap/void/clearance 1418, increasing the probability of a short between a first via segment 1408 and a second via segment 1410. Even if a short is not present, the small gap 1418 may be susceptible to current leakage and/or arcing. Due to the risk of shorting, leakage, arcing, and the uneven thickness of dielectric layers, the non-conductive dielectric layers may have to be made even wider. However, increasing the width of the plating resist 1404 and/or dielectric layer 1406*b* may not be an option due to thickness limitations (e.g., impedance controls, thickness controls, etc.).

FIGS. 15-29 illustrate various solutions to overcome the shortcomings of the single gap/void approach of FIGS. 13-14.

Figure 15:
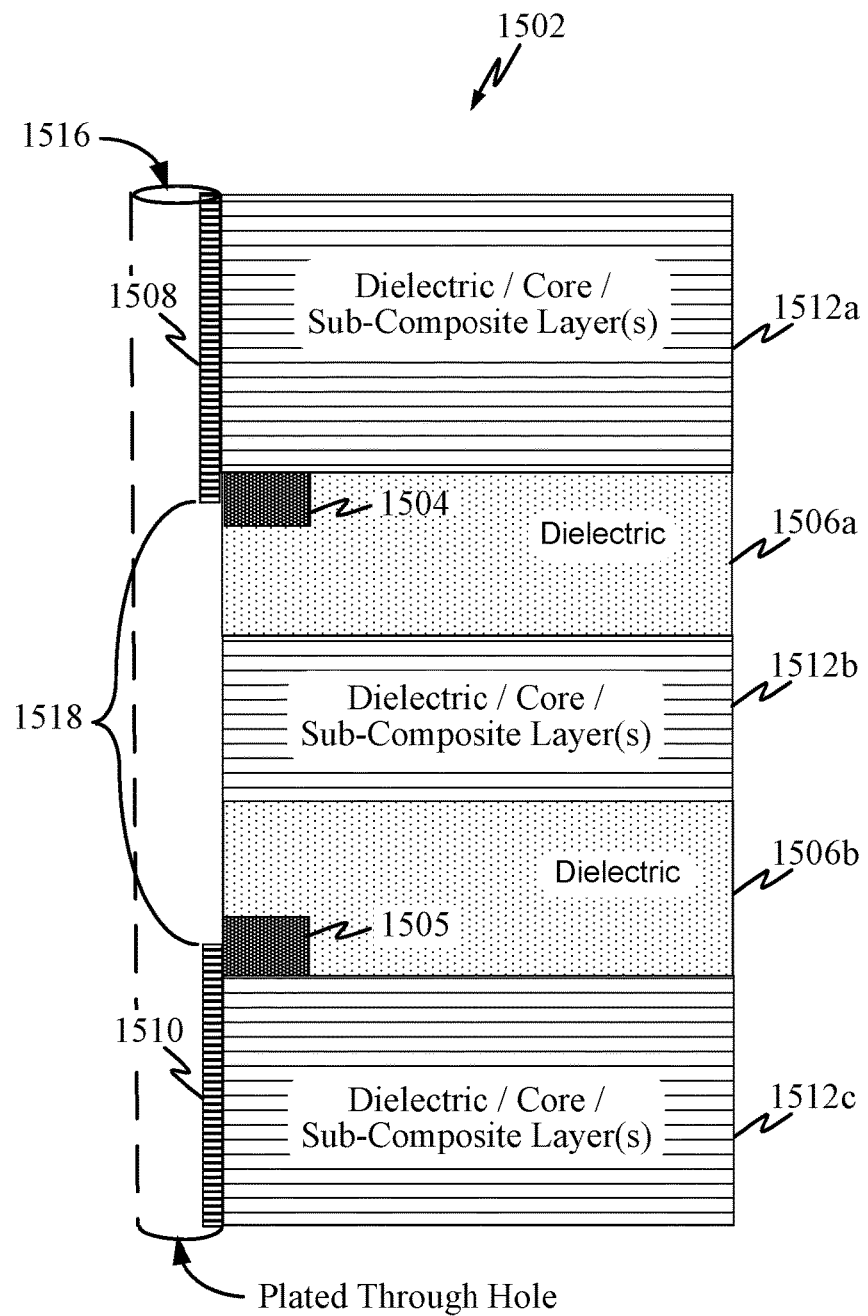
FIG. 15 illustrates a cross-sectional view of a portion of a multilayer PCB having a wide (longitudinal) gap/void/clearance formed within a plated through hole by using multiple points having plating resist material in one or more dielectric layers.

FIG. 15 illustrates a cross-sectional view of a portion of a multilayer PCB 1502 having a wide (longitudinal) gap/void/clearance 1518 formed within a plated through hole 1516 by using multiple points having plating resist material 1504 and 1505 in one or more dielectric layers 1506*a* and 1506*b*. Within the multilayer PCB 1502, the gap/void/clearance 1518 may be formed between the two plating resist materials 1504 and 1505. The multilayer PCB 1502 may also include additional dielectric, core structure, and/or sub-composite structure layers 1512*a*, 1512*b*, and 1512*c*. The first plating resist material 1504 and 1505 may comprise an insulating hydrophobic resinous material resistant to deposition of a catalytic species capable of catalyzing an electroless metal deposition. The first via segment 1504 and second via segment 1505 may be separated along a circumference of the partitioned plated through hole 1516.

In another example, the first and second plating resist may compose reduced surface area of drill hole surface compared with the materials used in the printed circuit board that effectively prevent deposition and/or allow to remove electrolyte plating seeds. In another example, a chemical or physical process may be used to remove electrolyte plating seeds using chemical or physical bonding force difference between plating resin surface and other area.

In one example, a first thickness of the first plating resist material 1504 may be less than a second thickness of a first dielectric layer 1506*a*. Similarly, a third thickness of the second plating resist material 1505 may be less than a fourth thickness of a second dielectric layer 1506*b*.

In another example, the first thickness of the first plating resist material 1504 is approximately the same as the second thickness of the first dielectric layer 1506*a*.

In one example, the core or sub-composite structure 1512*a*, 1512*b*, and/or 1512*c* may include at least one power plane and/or at least one a ground plane.

Figure 16:
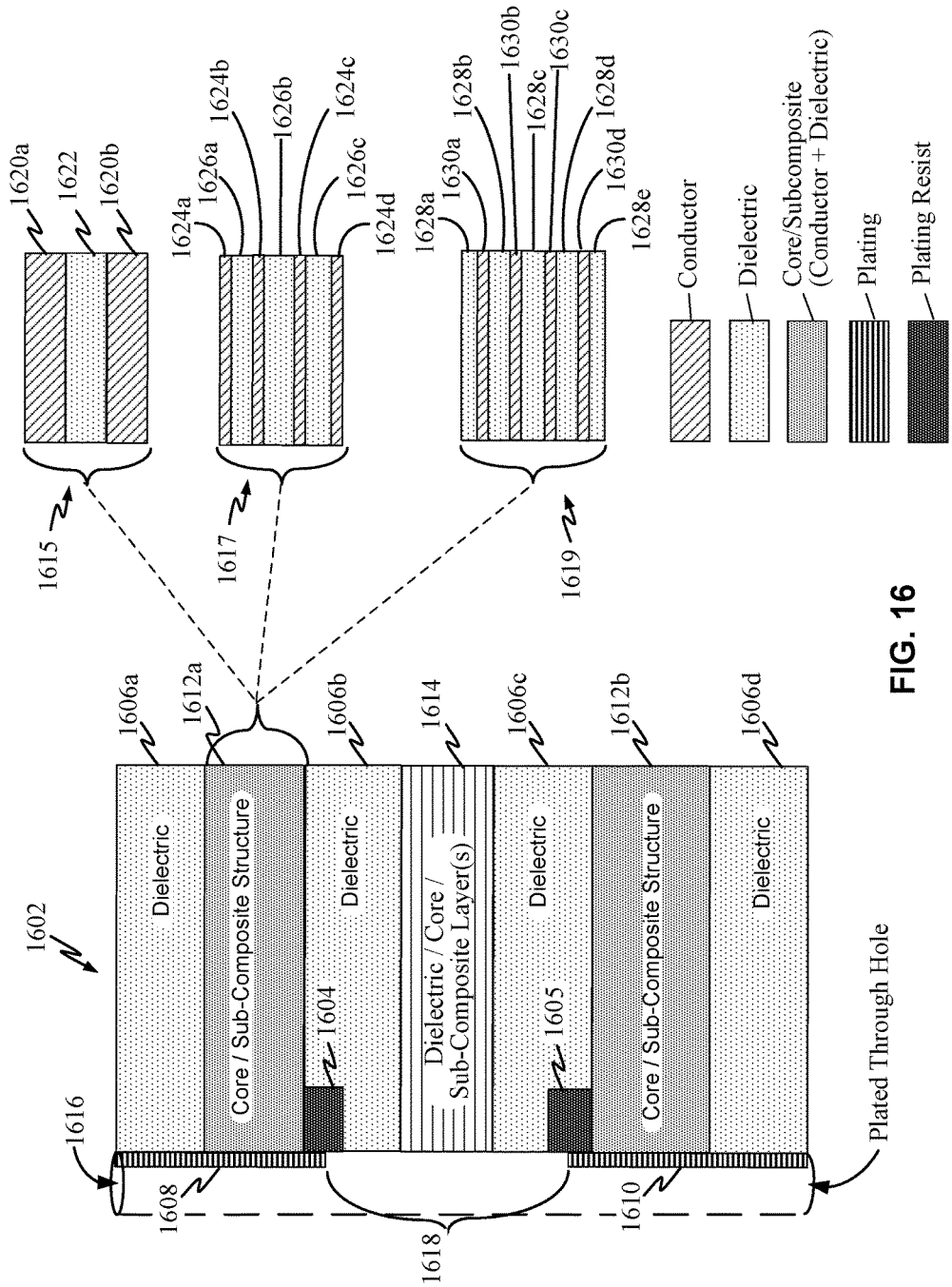
FIG. 16 illustrates a cross-sectional view of a portion of a multilayer PCB having a wide (longitudinal) gap/void formed within a plated through hole by using multiple points having plating resist material in one or more dielectric layers.

FIG. 16 illustrates a cross-sectional view of a portion of a multilayer PCB 1602 having a wide (longitudinal) gap/void 1618 formed within a plated through hole 1616 by using multiple points having plating resist material 1604 and 1605 in one or more dielectric layers 1606*b* and 1606*c*. The multilayer PCB 1602 may include a plurality of dielectric layers 1606*a*, 1606*b*, 1706*c*, and/or 1606*d*, a plurality of core or sub-composite structures 1612*a* and/or 1612*b*, and/or one or more dielectric, core, and/or sub-composite structure layers 1614. Within the multilayer PCB 1602, the gap/void/clearance 1618 may be formed between the two plating resist materials 1604 and 1605. In this example, the plating resist material 1604 and 1605 has been deposited on a first surface of a first core or sub-composite structure 1612*a* and a second surface of a second core or sub-composite structure 1612*b*. The multilayer PCB 1602 may also include additional dielectric, core structure, and/or sub-composite structure layers 1614 between the plating resist material 1604 and 1605. Additionally, a first dielectric layer 1606*a* may be placed on a second surface of the first core or sub-composite structure 1612*a* and a second dielectric layer 1606*b* may be placed on a first surface of the second core or sub-composite structure 1612*b*.

In one example, the structures 1612*a*, 1612*b*, and/or 1614 may be a core structure 1615 (e.g., flexible, semi-flexible/semi-rigid, or rigid) that include conductive layers (e.g., foils) 1620*a* and 1620*b* placed on either side of a dielectric material 1622 (e.g., prepreg). The dielectric material may be, for example, a prepreg, a bonding sheet, and/or sub-composite materials such as cured or partially cured resin and these may be impregnated with a reinforcement or reinforcing material or aggregate. Cured or partially cured resin may include epoxy, polyimide, polyphenylene ether (PPO), cyanate ester, hydrocarbon, polytetrafluoroethylene (PTFE), bismaleimide triazine (BT), phenol resin or any resin that is used for printed circuit board dielectric material as a pure or blended composition. Resin impregnated reinforcement may be used for the dielectric material 1622 and may include woven or unwoven glass fibers, Kevlar fibers, polyester fiber, carbon fiber, cellulose fiber or any other fiber that are used for printed circuit board. When unwoven reinforcement is used, this reinforcement may be fibers as chopped, powdered material, etc.

In a second example, the structures 1612*a*, 1612*b*, and/or 1614 may be a first sub-composite structure 1617 (e.g., flexible, semi-flexible/semi-rigid, or rigid) that includes one or more conductive layers (e.g., foils) 1624*a*, 1624*b*, 1624*c*, and/or 1624*d*, with one or more dielectric layers 1626*a*, 1626*b*, and/or 1626*c* in between. In this example, the composite structure 1617 has conductive layers on the top and bottom surfaces.

In a third example, the structures 1612*a*, 1612*b*, and/or 1614 may be a second sub-composite structure 1619 (e.g., flexible, semi-flexible/semi-rigid, or rigid) that includes one or more dielectric layers 1628*a*, 1628*b*, 1628*c*, 1628*d*, and/or 1628*e* with one or more conductive layers (e.g., foils) 1630*a*, 1630*b*, 1630*c*, and/or 1630*d* in between. In this example, the composite structure 1619 has dielectric layers on the top and bottom surfaces.

In some examples, one or more of the conductive layers within the core/sub-composite structures 1612*a* and/or 1612*b* may include electrical traces and/or pads that may have been formed by etching of the conductive layers 1620, 1624, and/or 1630.

Figure 17:
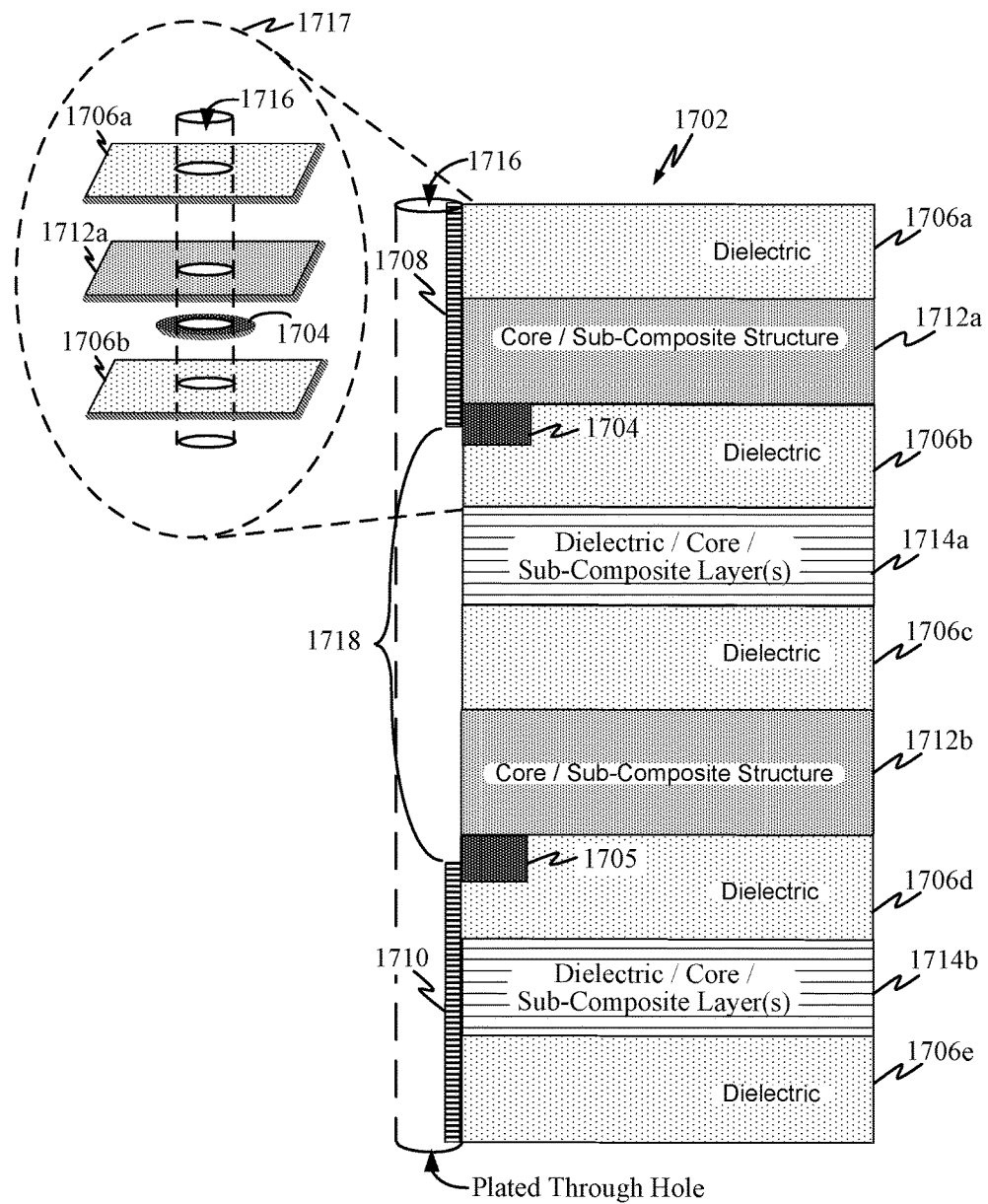
FIG. 17 illustrates a cross-sectional view of a portion of another multilayer PCB having a wide (longitudinal) gap/void formed within a plated through hole by using multiple points having plating resist material in one or more dielectric layers.

FIG. 17 illustrates a cross-sectional view of a portion of another multilayer PCB 1702 having a wide (longitudinal) gap/void 1718 formed within a plated through hole 1716 by using multiple points having plating resist material 1704 and 1705 in one or more dielectric layers 1706*b* and 1706*d*. The multilayer PCB 1702 may include a plurality of dielectric layers 1706*a*, 1706*b*, 1706*c*, 1706*d*, and/or 1706*e*, a plurality of core or sub-composite structures 1712*a* and/or 1712*b*, and/or one or more dielectric, core, and/or sub-composite structure layers 1714*a* and/or 1714*b*. Within the multilayer PCB 1702, the gap/void/clearance 1718 may be formed between the two plating resist materials 1704 and 1705. In this example, the plating resist material has been deposited on a first surface of a first core or sub-composite structure 1712*a* and a first surface of a second core or sub-composite structure 1712*b*. The multilayer PCB 1702 may also include additional dielectric, core structure, and/or sub-composite structure layers 1714*a* between the plating resist material 1704 and 1705. Additionally, a first dielectric layer 1706*a* may be placed on a second surface of the first core or sub-composite structure 1712*a* and a second dielectric layer 1706*c* may be placed on a second surface of the second core or sub-composite structure 1712*b*.

A perspective view 1717 of a portion of the multilayer PCB 1702 also illustrates that, in one example, the plating resist 1704 may be deposited on only a portion of the core or sub-composite structure 1712*a* corresponding to the location through which the PTH 1716 is to be placed. For instance, plating resist 1704 may be deposited in a region slightly larger than the hole to be formed/drilled for the PTH 1716. As a result, the plating resist 1704 and/or 1705 may be deposited on only selected regions or portions of the core or sub-composite structure 1712*a* and/or 1712*b* rather than on the whole surface of the core or sub-composite structure 1712*a* and/or 1712*b*. Consequently, in one example, the first plating resist 1704 and/or second plating resist 1705 may have a radius/diameter greater than a radius/diameter of the through hole.

Figure 18:
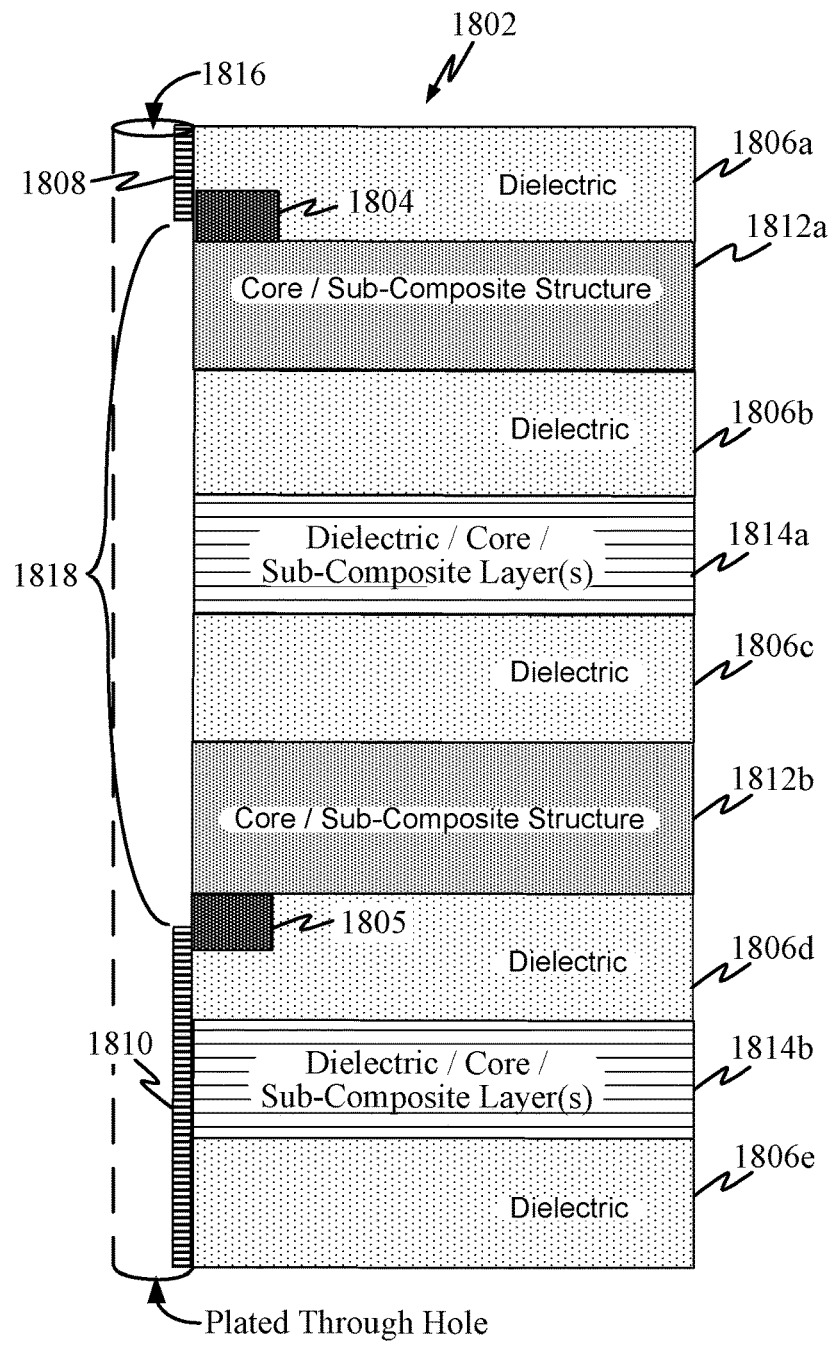
FIG. 18 illustrates a cross-sectional view of a portion of yet another multilayer PCB having a wide (longitudinal) gap/void formed within a plated through hole by using multiple points having plating resist material in one or more dielectric layers.

FIG. 18 illustrates a cross-sectional view of a portion of yet another multilayer PCB 1802 having a wide (longitudinal) gap/void 1818 formed within a plated through hole 1816 by using multiple points having plating resist material 1804 and 1805 in one or more dielectric layers 1806*a* and 1806*d*. The multilayer PCB 1802 may include a plurality of dielectric layers 1806*a*, 1806*b*, 1806*c*, 1806*d*, and/or 1806*e*, a plurality of core or sub-composite structures 1812*a* and/or 1812*b*, and/or one or more dielectric, core, and/or sub-composite structure layers 1814*a* and/or 1814*b*. In this example, the plating resist material has been deposited on a first surface of a first core or sub-composite structure 1812*a* and a second surface of a second core or sub-composite structure 1812*b*. The multilayer PCB 1802 may also include additional dielectric, core structure, and/or sub-composite structure layers 1814*a* between the plating resist material 1804 and 1805. When the plated through hole 1816 is formed through the multilayer PCB 1802, an interior surface of a through hole is plated with a conductive material except along a length/gap/void/clearance 1818 between the first plating resist material 1804 and the second plating resist material 1805 to form the partitioned plated through hole 1816 having a first via segment 1808 electrically isolated from a second via segment 1810.

Note that to avoid plating across an intermediate core or sub-composite structure 1812*a*, 1814*a*, and/or 1812*b*, those intermediate core or sub-composite structures may not form an electrical current path (e.g., it is not coupled to ground or power) during the plating process, thereby inhibiting plating material from depositing along the thickness of the intermediate core or sub-composite structures 1812*a*, 1814*a*, and/or 1812*b* in the through hole.

Figure 19:
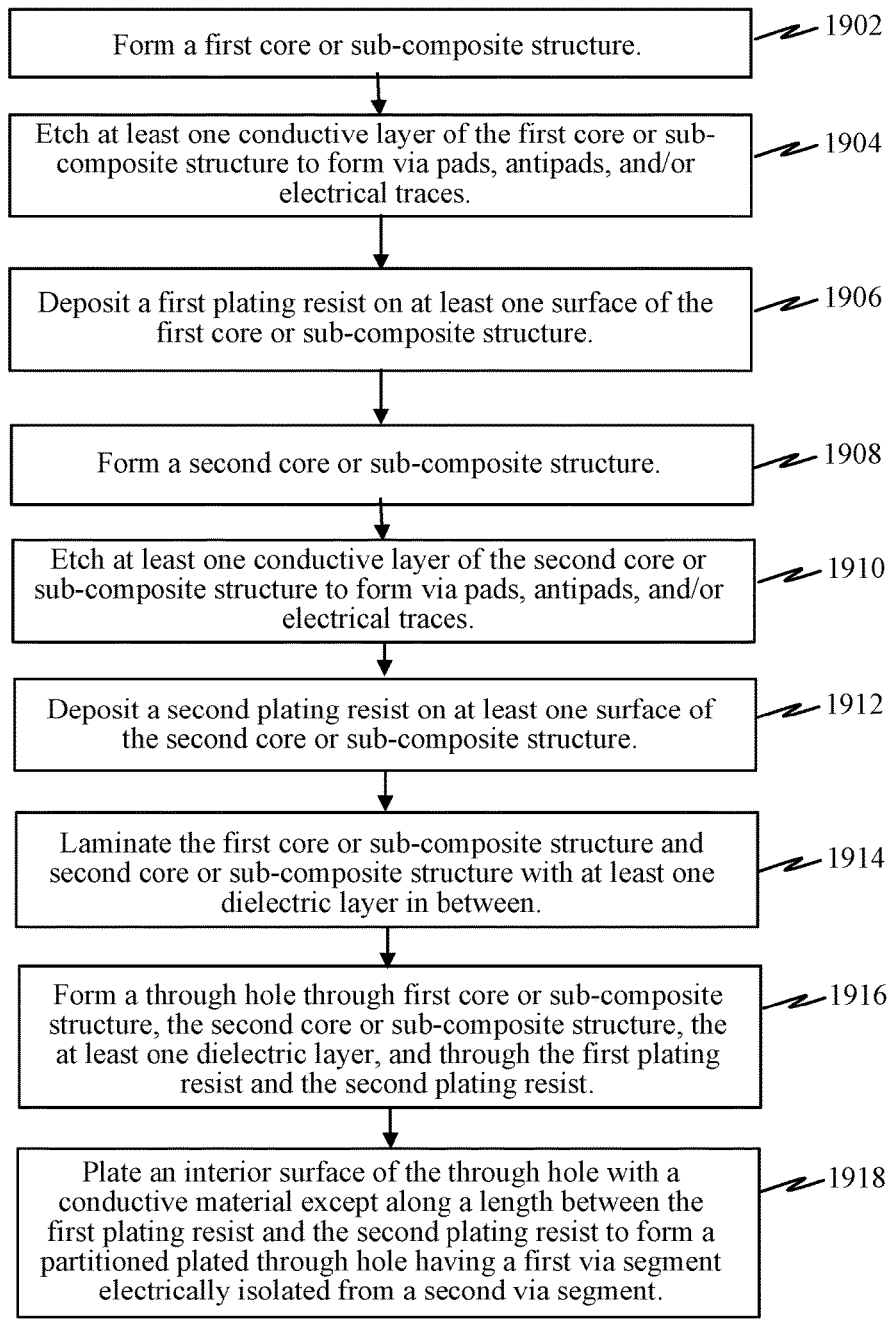
FIG. 19 illustrates a method for forming the PCBs of FIGS. 15, 16, 17, and/or 18. A first core or sub-composite structure is formed.

FIG. 19 illustrates a method for forming the PCBs of FIGS. 15, 16, 17, and/or 18. A first core or sub-composite structure is formed 1902. For instance, the first core or sub-composite structure may be the core or sub-composite structure 1512*a* (FIG. 15), 1612*a* (FIG. 16), 1712*a* (FIG. 17), and/or 1812*a* (FIG. 18). At least one conductive layer of the first core or sub-composite structure may be etched to form via pads, antipads, and/or electrical traces 1904. For instance, such etching may serve to form electrical paths to/from points where vias are to be formed. A first plating resist material may then be deposited on at least one surface of the first core or sub-composite structure 1906. For instance, the first plating resist may be the plating resist 1504 (FIG. 15) on the bottom surface of the core or sub-composite structure 1512a (FIG. 15), plating resist 1604 (FIG. 16) on the bottom surface of the core or sub-composite structure 1612a (FIG. 16), plating resist 1704 (FIG. 17) on the bottom surface of the core or sub-composite structure 1712a (FIG. 17), and/or plating resist 1804 (FIG. 18) on the top surface of the core or sub-composite structure 1812a (FIG. 18).

Similarly, a second core or sub-composite structure is formed 1908. For instance, the second core or sub-composite structure may be the core or sub-composite structure 1512c (FIG. 15), 1612b (FIG. 16), 1712b (FIG. 17), and/or 1812b (FIG. 18). At least one conductive layer of the first core or sub-composite structure may be etched to form via pads, antipads, and/or electrical traces 1910. For instance, such etching may serve to form electrical paths to/from points where vias are to be formed. A second plating resist material may then be deposited on at least one surface of the second core or sub-composite structure 1912. For instance, the second plating resist may be the plating resist 1505 (FIG. 15) on the top surface of the core or sub-composite structure 1512c (FIG. 15), plating resist 1605 (FIG. 16) on the top surface of the core or sub-composite structure 1612b (FIG. 16), plating resist 1705 (FIG. 17) on the bottom surface of the core or sub-composite structure 1712b (FIG. 17), and/or plating resist 1805 (FIG. 18) on the bottom surface of the core or sub-composite structure 1812b (FIG. 18).

The first core or sub-composite structure and second core or sub-composite structure may then be laminated with at least one dielectric layer in between 1914. A through hole may then be formed through first core or sub-composite structure, the second core or sub-composite structure, the at least one dielectric layer, and through the first plating resist and the second plating resist 1916. An interior surface of the through hole may be plated with a conductive material except along a length between the first plating resist and the second plating resist to form a partitioned plated through hole having a first via segment electrically isolated from a second via segment 1918. For instance, the plated through hole may be the plated through hole 1516, 1616, 1716, and/or 1816. That is, as a result of the positioning of the first and second plating resist materials (such as 1504/1505 in FIG. 15, 1604/1605 in FIG. 16, 1704/1705 in FIG. 17, and/or 1804/1805 in FIG. 18), plating material does not adhere to the region between the first and second plating resist materials, thereby creating a void/gap/clearance along the plated through hole.

Figure 20:
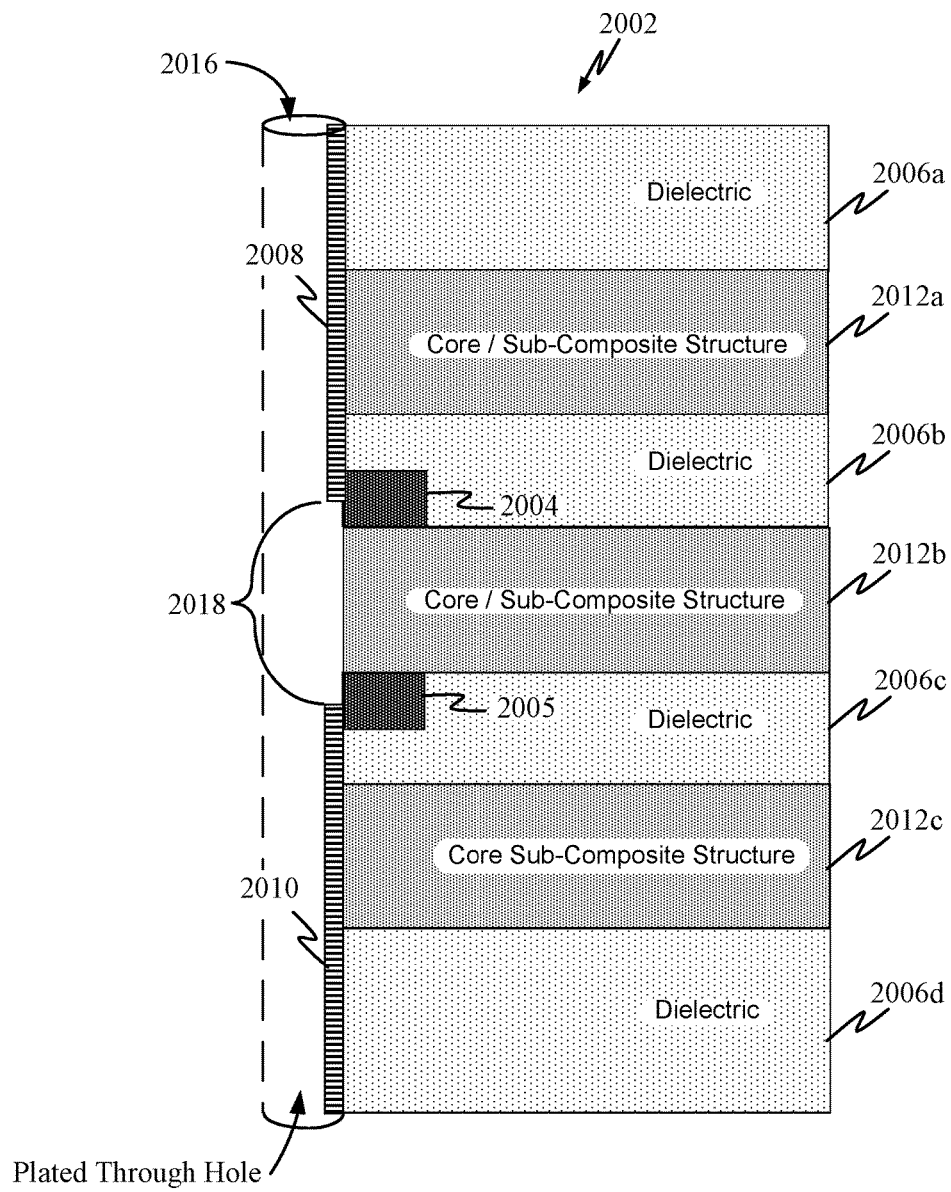
FIG. 20 illustrates a cross-sectional view of a portion of yet another multilayer PCB having a wide (longitudinal) gap/void formed within a plated through hole by using multiple points having plating resist material in one or more dielectric layers.

FIG. 20 illustrates a cross-sectional view of a portion of yet another multilayer PCB 2002 having a wide (longitudinal) gap/void 2018 formed within a plated through hole 2016 by using multiple points having plating resist material 2004 and 2005 in one or more dielectric layers 2006b and 2006c. The multilayer PCB 2002 may include a plurality of dielectric layers 2006a, 2006b, 2006c, and/or 2006d, a plurality of core or sub-composite structures 2012a, 2012b, and/or 2012c. Within the multilayer PCB 2002, the gap/void/clearance 2018 may be formed between the two plating resist materials 2004 and 2005. In this example, the plating resist material has been deposited on a first surface of a first core or sub-composite structure 2012b and a second surface of the first core or sub-composite structure 2012b. Subsequently, when the plated through hole 2016 is formed through the multilayer PCB 2002, an interior surface of a through hole is plated with a conductive material except along a length/gap/void/clearance 2018 between the first plating resist material 2004 and the second plating resist material 2005 to form the partitioned plated through hole 2016 having a first via segment 2008 electrically isolated from a second via segment 2010.

Note that to avoid plating across the intermediate core or sub-composite structure 2012b, that intermediate core or sub-composite structure 2012b may not form an electrical current path (e.g., it is not coupled to ground or power) during the plating process, thereby inhibiting plating material from depositing along the thickness of the intermediate core or sub-composite structure 2012b in the through hole.

Figure 21:
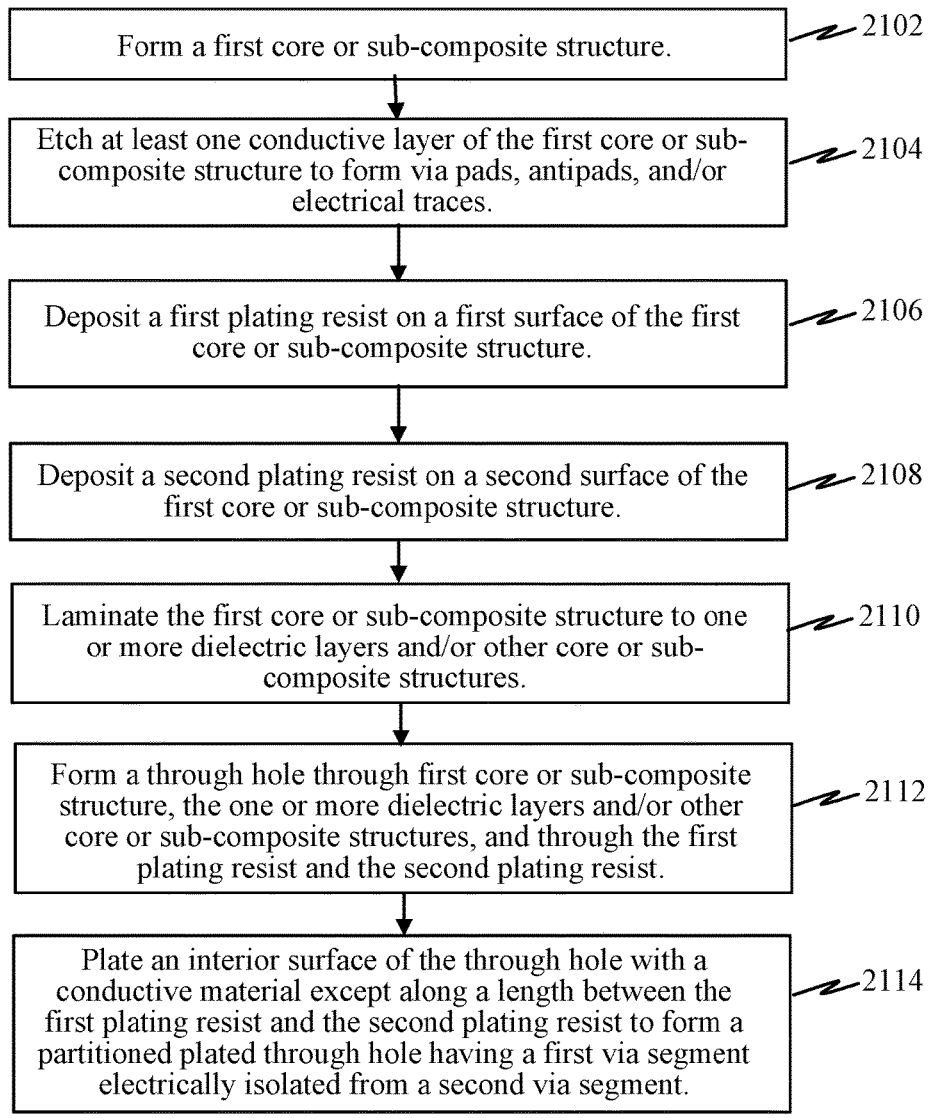
FIG. 21 illustrates a method for forming the PCB of FIG. 20.

FIG. 21 illustrates a method for forming the PCB of FIG. 20. A first core or sub-composite structure is formed 2102. For instance, the first core or sub-composite structure may be the core or sub-composite structure 2012b (FIG. 20). At least one conductive layer of the first core or sub-composite structure may be etched to form via pads, antipads, and/or electrical traces 2104. For instance, such etching may serve to form electrical paths to/from points where vias are to be formed. A first plating resist material may then be deposited on a first surface of the first core or sub-composite structure 2106. For instance, the first plating resist may be the plating resist 2004 (FIG. 20) on the top surface of the core or sub-composite structure 2012b (FIG. 20). A second plating resist material may then be deposited on a second surface of the first core or sub-composite structure 2108. For instance, the second plating resist may be the plating resist 2005 (FIG. 20) on the bottom surface of the core or sub-composite structure 2012b (FIG. 20).

The first core or sub-composite structure may then be laminated to one or more dielectric layers and/or other core or sub-composite structures 2110. A through hole may then be formed through first core or sub-composite structure, the one or more dielectric layers, the other core or sub-composite structures, and through the first plating resist and the second plating resist 2112. An interior surface of the through hole may be plated with a conductive material except along a length between the first plating resist and the second plating resist to form a partitioned plated through hole having a first via segment electrically isolated from a second via segment 2114. That is, as a result of the positioning of the first and second plating resist materials (such as 2004 and 2005 in FIG. 20), plating material does not adhere to the region between the first and second plating resist materials, thereby creating a void/gap/clearance along the plated through hole.

Figure 22:
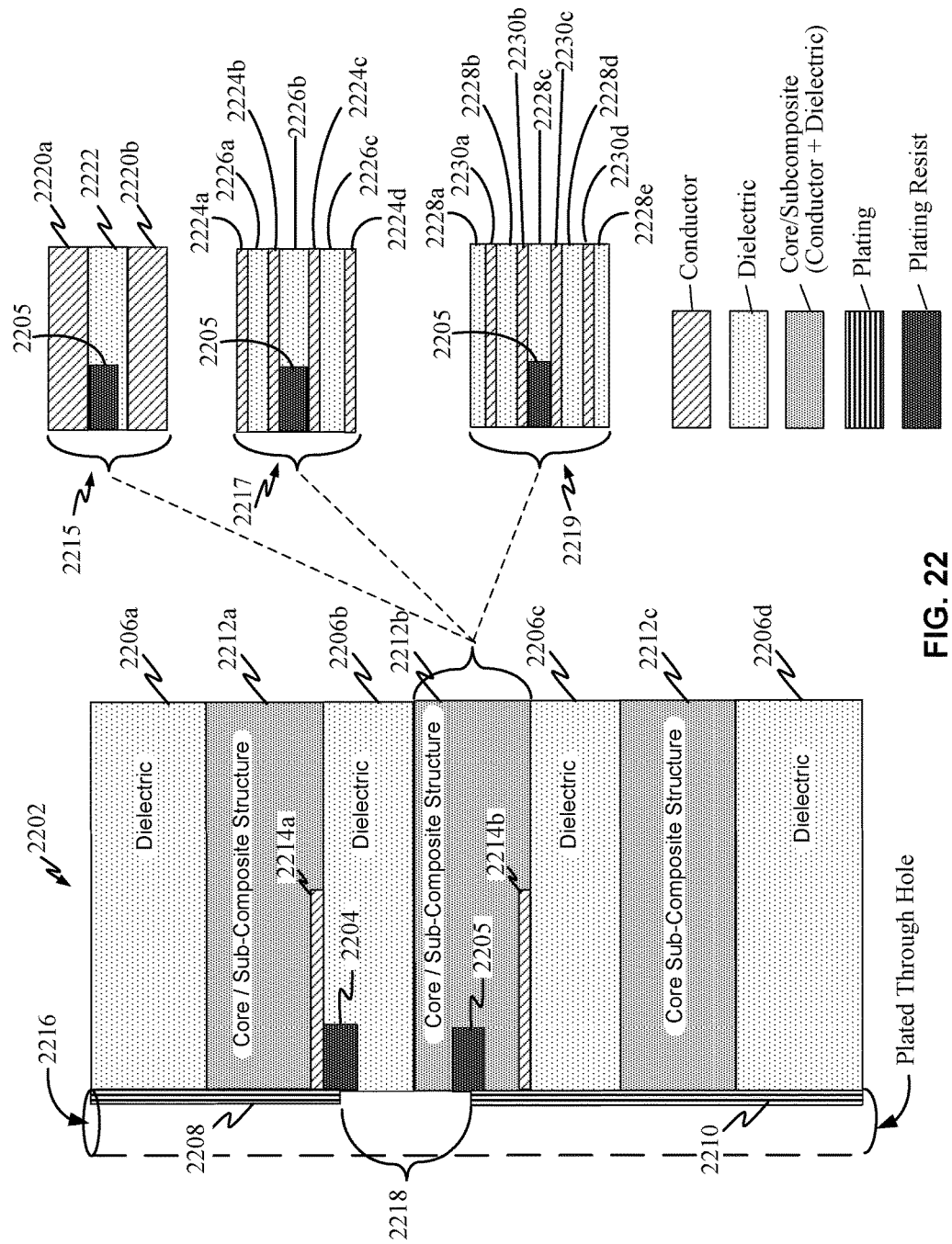
FIG. 22 illustrates a cross-sectional view of a portion of yet another multilayer PCB having a wide (longitudinal) gap/void formed within a plated through hole by using multiple points having plating resist material including within at least a core or sub-composite structure.

FIG. 22 illustrates a cross-sectional view of a portion of yet another multilayer PCB 2202 having a wide (longitudinal) gap/void 2218 formed within a plated through hole 2216 by using multiple points having plating resist material 2204 and 2205 including within at least a core or sub-composite structure. The multilayer PCB 2202 may include a plurality of dielectric layers 2206a, 2206b, 2206c, and/or 2206d, a plurality of core or sub-composite structures 2212a, 2212b, and/or 2212c. Within the multilayer PCB 2202, the gap/void/clearance 2218 may be formed between the two plating resist materials 2204 and 2205. In this example, a first plating resist material 2204 has been deposited on a first surface of a first core or sub-composite structure 2212a. For instance, the first plating resist material 2204 may be deposited on a conductive layer or conductive pad/trace 2214a that is part of the first core or sub-composite structure 2212a. A second plating resist material 2205 may be deposited within a second core or sub-composite structure 2212b. For instance, the second plating resist material 2205 may be deposited within a conductive or dielectric layer of the second core or sub-composite structure 2212b while such structure is being formed. Subsequently, when the plated through hole 2216 is formed through the multilayer PCB 2202, an interior surface of a through hole is plated with a conductive material except along a length/gap/ void/clearance 2218 between the first plating resist material 2204 and the second plating resist material 2205 to form the partitioned plated through hole 2216 having a first via segment 2208 electrically isolated from a second via segment 2210.

In one example, the first core or sub-composite structure 2212b may be a flexible, semi-flexible/semi-rigid, or rigid structure that includes conductive layers (e.g., foils) 2220a and 2220b placed on either side of a dielectric material 2222 (e.g., prepreg). The dielectric material may be, for example, a prepreg, a bonding sheet, and/or sub-composite materials such as cured or partially cured resin and these may be impregnated with a reinforcement or reinforcing material or aggregate. Cured or partially cured resin may include epoxy, polyimide, polyphenylene ether (PPO), cyanate ester, hydrocarbon, polytetrafluoroethylene (PTFE), bismaleimide triazine (BT), phenol resin or any resin that is used for printed circuit board dielectric material as a pure or blended composition. Resin impregnated reinforcement may be used for the dielectric material 2222 and may include woven or unwoven glass fibers, Kevlar fibers, polyester fiber, carbon fiber, cellulose fiber or any other fiber that are used for printed circuit board. When unwoven reinforcement is used, this reinforcement may be fibers as chopped, powdered material, etc. The second plating resist material 2205 may be deposited within dielectric layer 2222.

In a second example, the first core or sub-composite structure 2212a may be a flexible, semi-flexible/semi-rigid, or rigid structure that includes one or more conductive layers (e.g., foils) 2224a, 2224b, 2224c, and/or 2224d, with one or more dielectric layers 2226a, 2226b, and/or 2226c in between. In this example, the composite structure 2217 has conductive layers on the top and bottom surfaces. The second plating resist material 2205 may be deposited within a dielectric layer 2226b.

In a third example, the first core or sub-composite structure 2212a may be a flexible, semi-flexible/semi-rigid, or rigid structure that includes one or more dielectric layers 2228a, 2228b, 2228c, 2228d, and/or 2228e with one or more conductive layers (e.g., foils) 2230a, 2230b, 2230c, and/or 2230d in between. In this example, the composite structure 1619 has dielectric layers on the top and bottom surfaces. The second plating resist material 2205 may be deposited within dielectric layer 2228c.

In some examples, one or more of the conductive layers within the core/sub-composite structures 2212a and/or 2212b may include electrical traces and/or pads that may have been formed by etching of the conductive layers 2220, 2224, and/or 2230.

Figure 23:
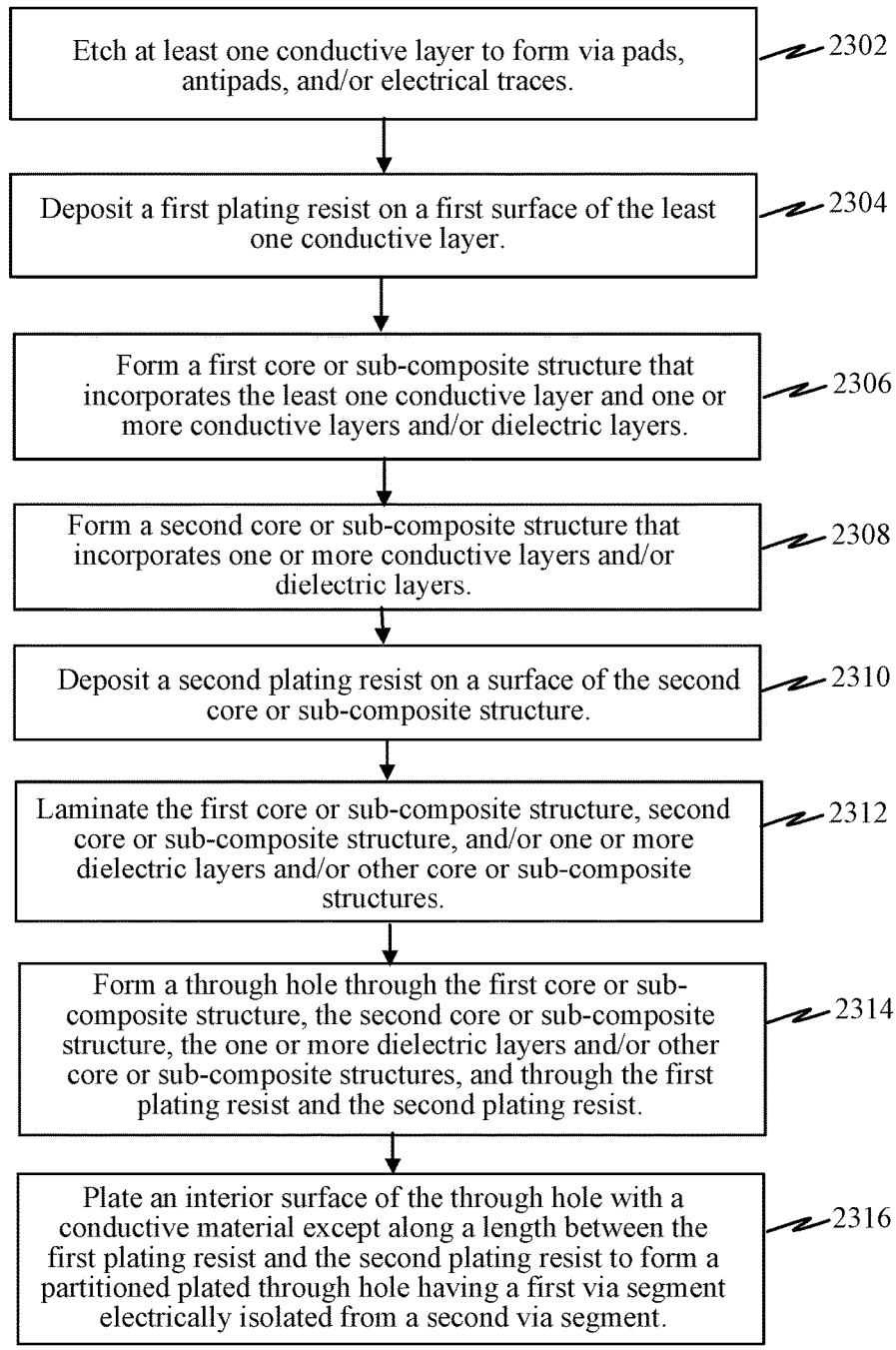
FIG. 23 illustrates a method for forming an extended via gap/void/clearance in the multilayer PCB of FIG. 22.

FIG. 23 illustrates a method for forming an extended via gap/void/clearance in the multilayer PCB of FIG. 22. At least one conductive layer may be etched to form via pads, antipads, and/or electrical traces 2302. A first plating resist 2205 may be deposited on a first surface of the least one conductive layer 2304. A first core or sub-composite structure 2212b may then be formed that incorporates the least one conductive layer and one or more conductive layers and/or dielectric layers 2306. A second core or sub-composite structure 2212a may also be that incorporates one or more conductive layers and/or dielectric layers 2308. A second plating resist may also be deposited on a surface of the second core or sub-composite structure 2310.

The first core or sub-composite structure 2212b, second core or sub-composite structure 2212a, and/or one or more dielectric layers and/or other core or sub-composite structures may then be laminated together 2312 in one or more steps. A through hole may be formed through the first core or sub-composite structure, the second core or sub-composite structure, the one or more dielectric layers and/or other core or sub-composite structures, and through the first plating resist and the second plating resist 2314. An interior surface of the through hole may be plated with a conductive material except along a length between the first plating resist and the second plating resist to form a partitioned plated through hole having a first via segment electrically isolated from a second via segment 2316.

Figure 24:
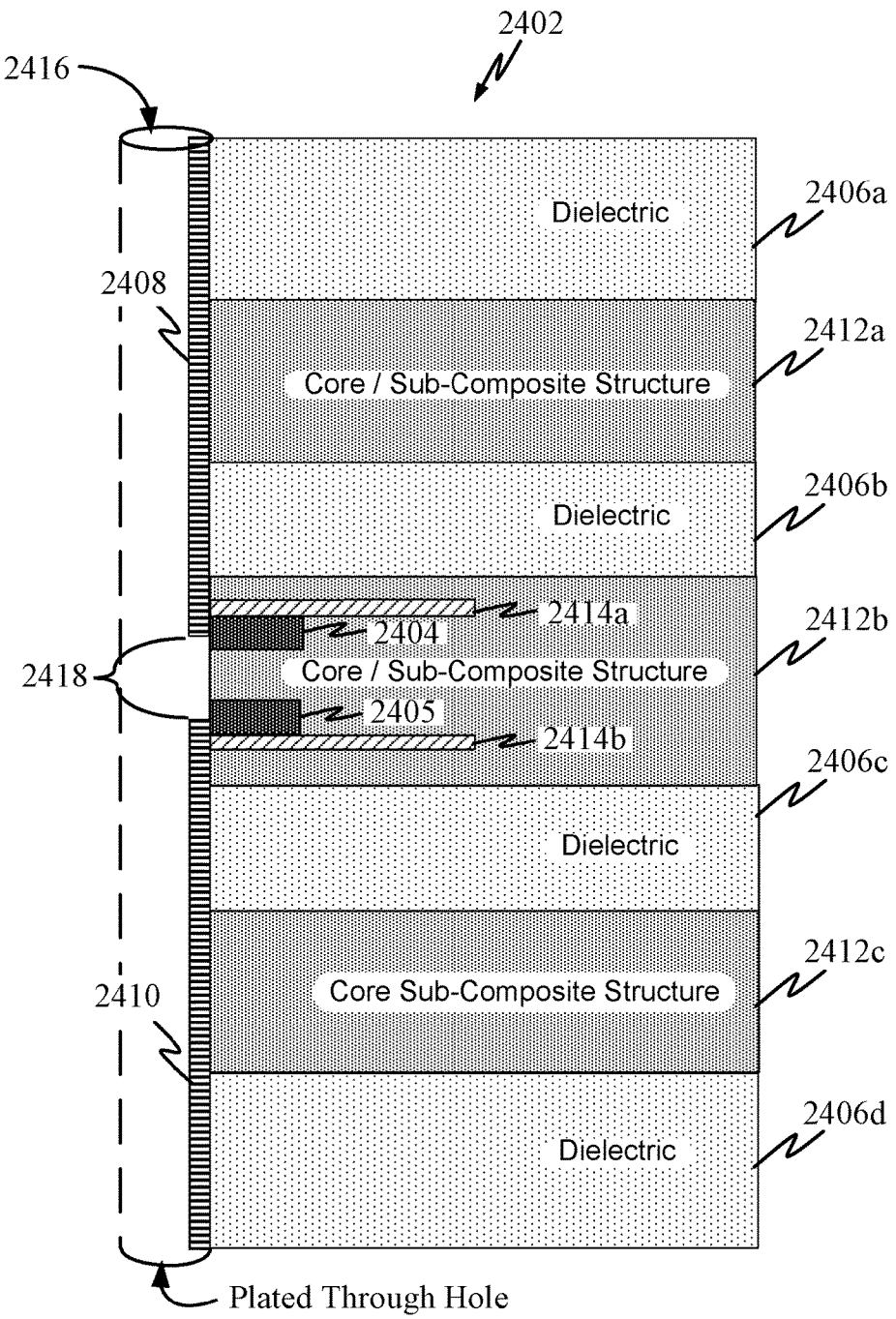
FIG. 24 illustrates a cross-sectional view of a portion of yet another multilayer PCB having a wide (longitudinal) gap/void formed within a plated through hole by using multiple points of plating resist material within a single core or sub-composite structure.

FIG. 24 illustrates a cross-sectional view of a portion of yet another multilayer PCB 2402 having a wide (longitudinal) gap/void 2418 formed within a plated through hole 2416 by using multiple points of plating resist material 2404 and 2405 within a single core or sub-composite structure. The multilayer PCB 2402 may include a plurality of dielectric layers 2406a, 2406b, 2406c, and/or 2406d, a plurality of core or sub-composite structures 2412a, 2412b, and/or 2412c. Within the multilayer PCB 2402, the gap/void/clearance 2418 may be formed between the two plating resist materials 2404 and 2405. In this example, a first plating resist material 2404 has been deposited on a first surface of a first core or sub-composite structure 2412b. For instance, the first plating resist material 2404 may be deposited on a conductive layer or conductive pad/trace 2414a that is part of the first core or sub-composite structure 2412b. A second plating resist material 2405 may be deposited on a second surface of the first core or sub-composite structure 2412a. For instance, the second plating resist material 2405 may be deposited within a conductive or dielectric layer of the first core or sub-composite structure 2412b while such structure is being formed. Subsequently, when the plated through hole 2416 is formed through the multilayer PCB 2402, an interior surface of a through hole is plated with a conductive material except along a length/gap/void/clearance 2418 between the first plating resist material 2404 and the second plating resist material 2405 to form the partitioned plated through hole 2416 having a first via segment 2408 electrically isolated from a second via segment 2410.

Figure 25:
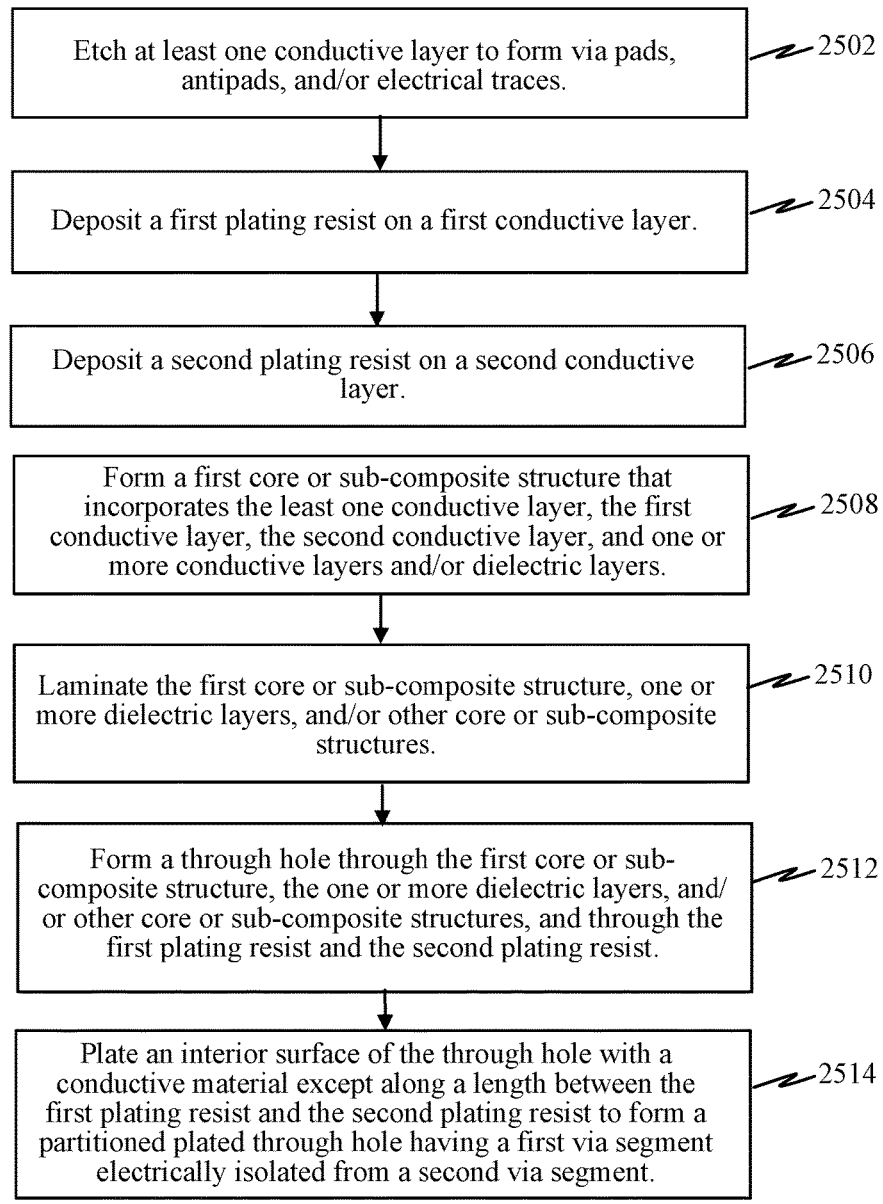
FIG. 25 illustrates a method for forming an extended via gap/void/clearance in the multilayer PCB of FIG. 24.

FIG. 25 illustrates a method for forming an extended via gap/void/clearance in the multilayer PCB of FIG. 24. At least one conductive layer may be etched to form via pads, antipads, and/or electrical traces 2502. A first plating resist 2404 may be deposited on a first conductive layer 2504. A second plating resist 2405 may be deposited on a first conductive layer 2506. A first core or sub-composite structure 2412b may then be formed that incorporates the least one conductive layer, the first conductive layer, the second conductive layer, and/or one or more conductive layers and/or dielectric layers 2508.

The first core or sub-composite structure 2412b, and/or one or more dielectric layers and/or other core or sub-composite structures may then be laminated together 2510 in one or more steps. A through hole may be formed through the first core or sub-composite structure, the one or more dielectric layers, and/or other core or sub-composite structures, and through the first plating resist and the second plating resist 2512. An interior surface of the through hole may be plated with a conductive material except along a length between the first plating resist and the second plating resist to form a partitioned plated through hole having a first via segment electrically isolated from a second via segment 2514.

Figure 26:
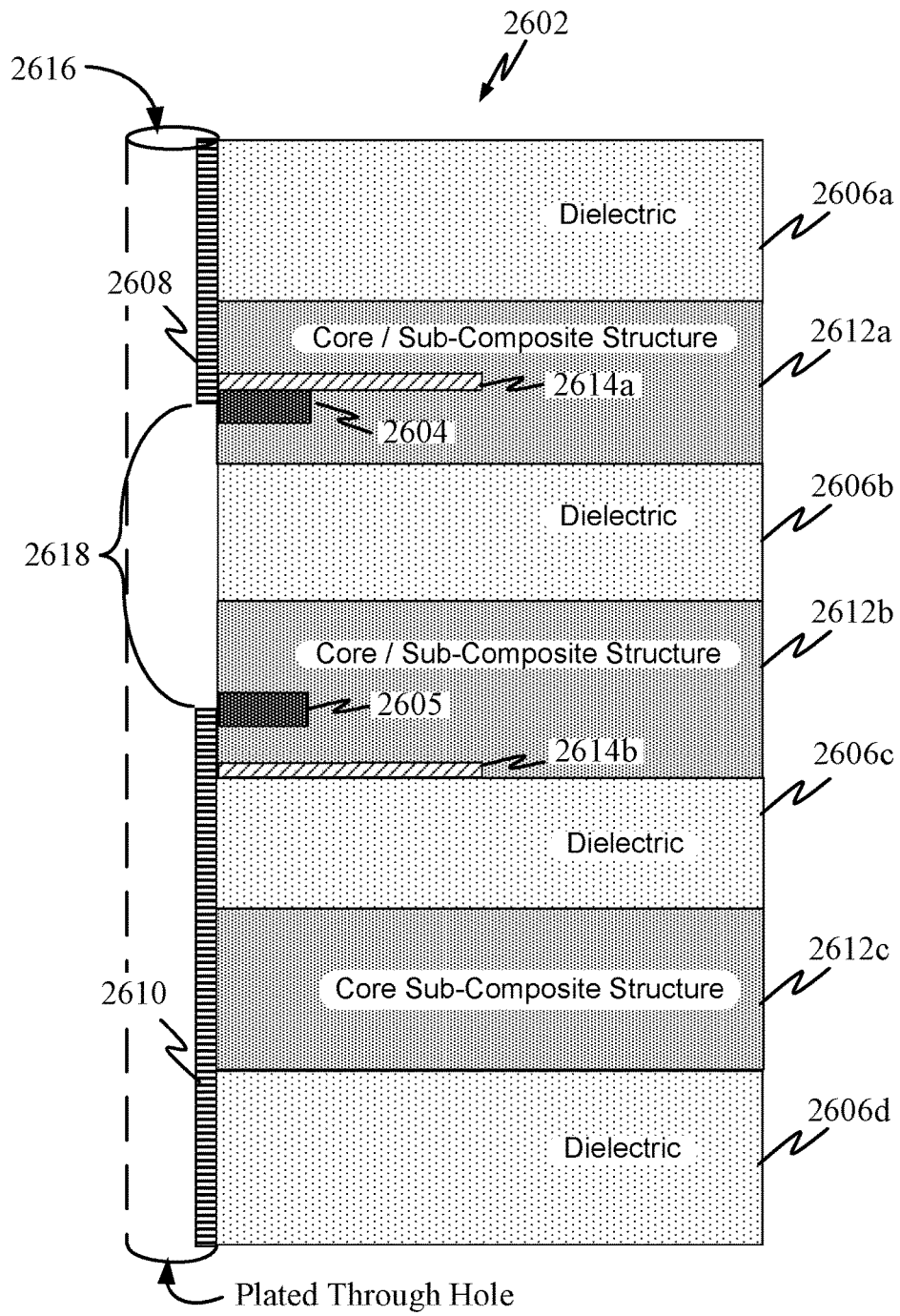
FIG. 26 illustrates a cross-sectional view of a portion of yet another multilayer PCB having a wide (longitudinal) gap/void formed within a plated through hole by using multiple points of plating resist material within two different core or sub-composite structures.

FIG. 26 illustrates a cross-sectional view of a portion of yet another multilayer PCB 2602 having a wide (longitudinal) gap/void 2618 formed within a plated through hole 2616 by using multiple points of plating resist material 2604 and 2605 within two different core or sub-composite structures. The multilayer PCB 2602 may include a plurality of dielectric layers 2606a, 2606b, 2606c, and/or 2606d, a plurality of core or sub-composite structures 2612a, 2612b, and/or 2612c. Within the multilayer PCB 2602, the gap/void/clearance 2618 may be formed between the two plating resist materials 2604 and 2605. In this example, a first plating resist material 2604 has been deposited on a first surface of a first core or sub-composite structure 2612a. For instance, the first plating resist material 2604 may be deposited on a conductive layer or conductive pad/trace 2614a that is part of the first core or sub-composite structure 2612a. A second plating resist material 2605 may be deposited on a second surface of the second core or sub-composite structure 2612b. For instance, the second plating resist material 2605 may be deposited within a conductive or dielectric layer of the second core or sub-composite structure 2612b while such structure is being formed. Subsequently, when the plated through hole 2616 is formed through the multilayer PCB 2602, an interior surface of a through hole is plated with a conductive material except along a length/gap/void/clearance 2618 between the first plating resist material 2604 and the second plating resist material 2605 to form the partitioned plated through hole 2616 having a first via segment 2608 electrically isolated from a second via segment 2610.

Figure 27:
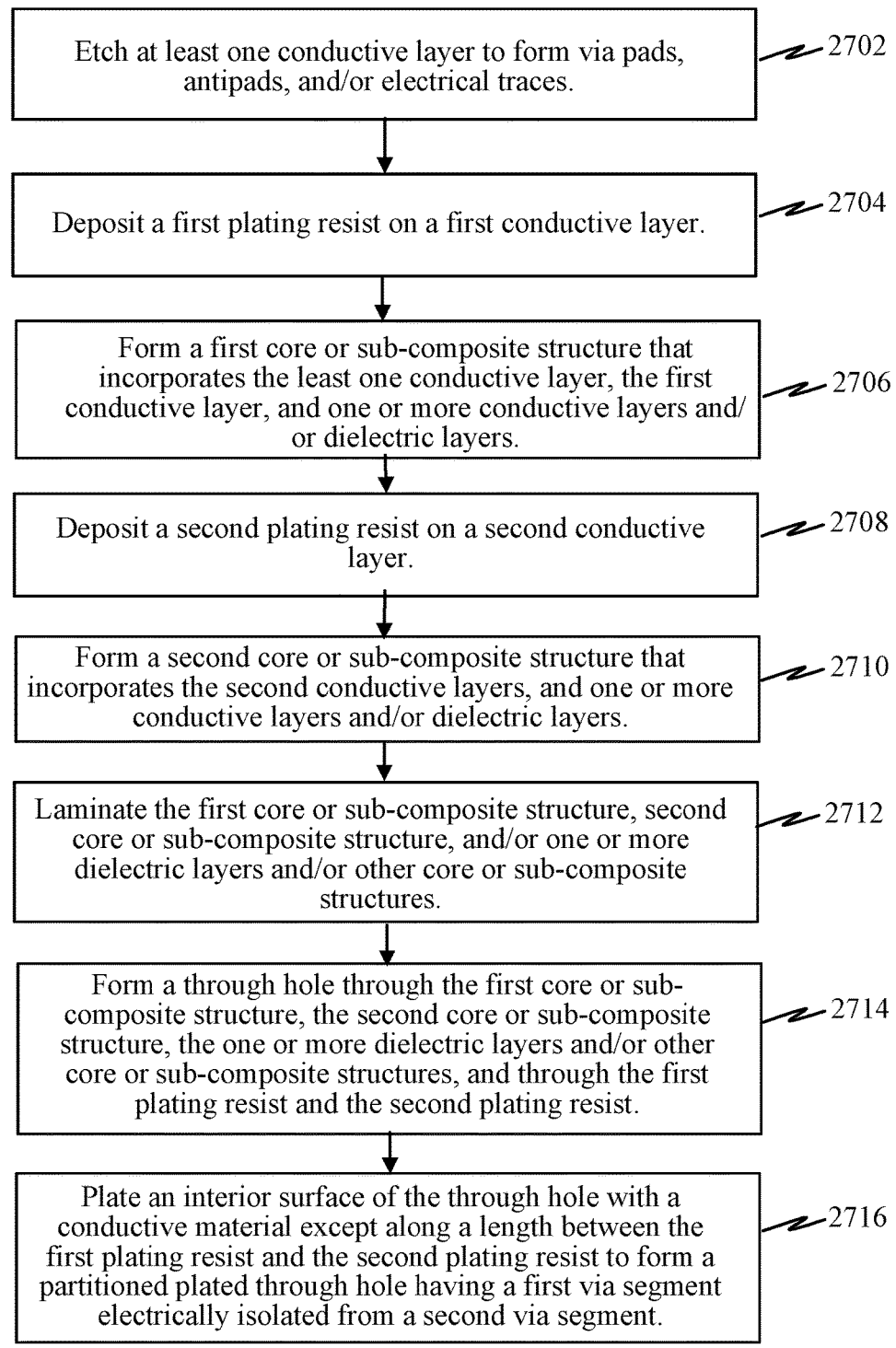
FIG. 27 illustrates a method for forming an extended via gap/void/clearance in the multilayer PCB of FIG. 26.

FIG. 27 illustrates a method for forming an extended via gap/void/clearance in the multilayer PCB of FIG. 26. At least one conductive layer may be etched to form via pads, antipads, and/or electrical traces 2702. A first plating resist 2604 may be deposited on a first conductive layer 2704. A first core or sub-composite structure 2612a may then be formed that incorporates the least one conductive layer, the first conductive layer, and/or one or more conductive layers and/or dielectric layers 2706.

A second plating resist 2605 may be deposited on a second conductive layer 2708. A second core or sub-composite structure 2612b may then be formed that incorporates the first conductive layer, and/or one or more conductive layers and/or dielectric layers 2710.

The first core or sub-composite structure 2612a, second core or sub-composite structure 2612b, and/or one or more dielectric layers and/or other core or sub-composite structures may then be laminated together 2712 in one or more steps. A through hole may be formed through the first core or sub-composite structure, the first core or sub-composite structure, the one or more dielectric layers, and/or other core or sub-composite structures, and through the first plating resist and the second plating resist 2714. An interior surface of the through hole may be plated with a conductive material except along a length between the first plating resist and the second plating resist to form a partitioned plated through hole having a first via segment electrically isolated from a second via segment 2716.

Figure 28:
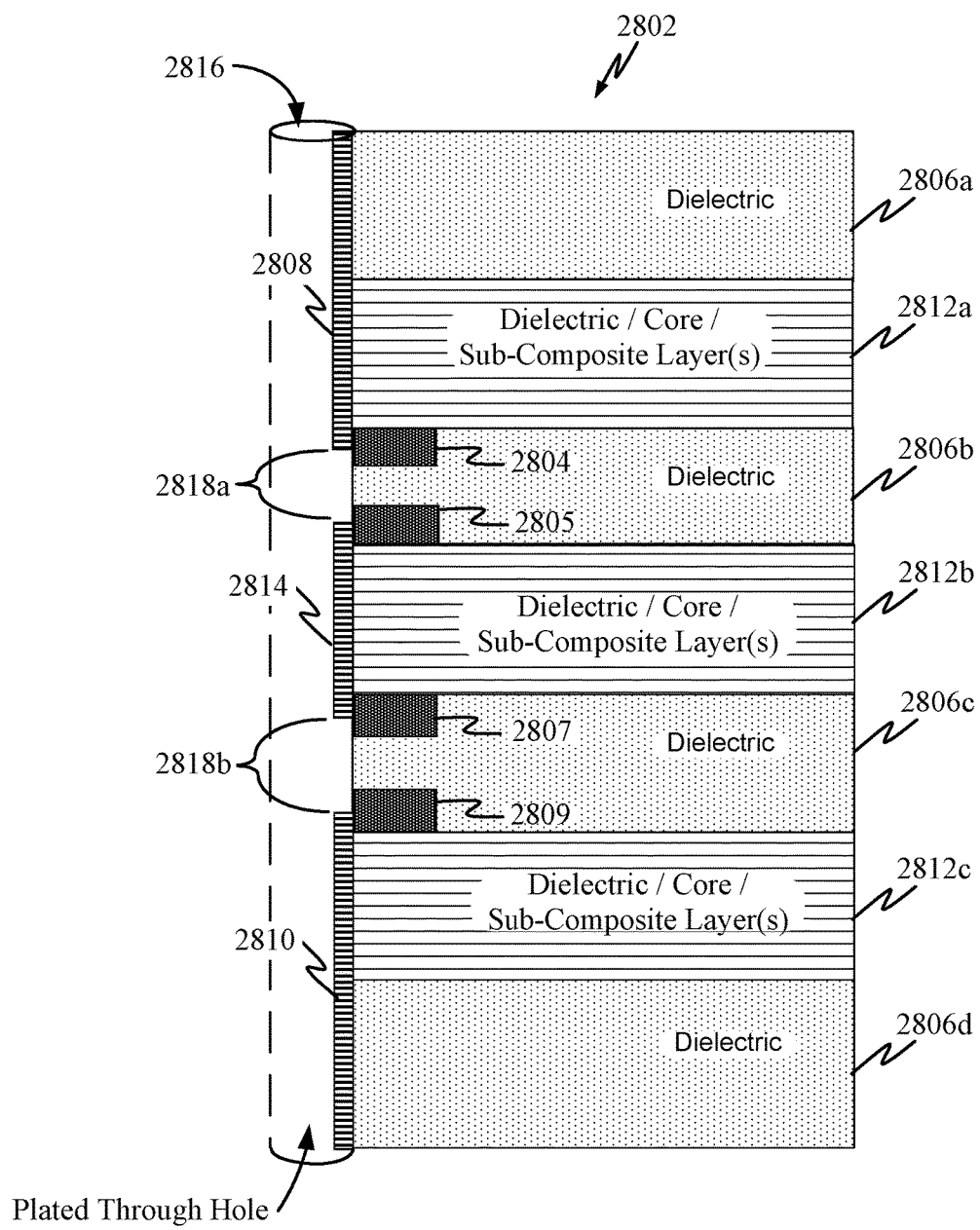
FIG. 28 illustrates a cross-sectional view of a portion of yet another multilayer PCB having a plurality of wide (longitudinal) gaps/voids/clearances formed within a plated through hole by using multiple points having plating resist material in one or more dielectric layers.

FIG. 28 illustrates a cross-sectional view of a portion of yet another multilayer PCB 2802 having a plurality of wide (longitudinal) gaps/voids/clearances 2818a and 2818b formed within a plated through hole 2816 by using multiple points having plating resist material 2804, 2805, 2807, and 2809 in one or more dielectric layers 2806b and 2806c. The multilayer PCB 2802 may include a plurality of dielectric layers 2806a, 2806b, 2806c, and/or 2806d, a plurality of dielectric layers, core structures, or sub-composite structures 2812a, 2812b, and/or 2812c. Within the multilayer PCB 2802, the gaps/voids/clearances 2818a and 2818b may be formed between the two plating resist materials 2804/2805 or 2807/2809, respectively. In one example, plating resist material 2804/2805 has been deposited on a first core or sub-composite structure 2812a and a first surface of a second core or sub-composite structure 2812b, respectively. Similarly, plating resist material 2807/2809 has been deposited on a second surface of the second core or sub-composite structure 2812b and on a third core or sub-composite structure 2812c, respectively. Subsequently, when the plated through hole 2816 is formed through the multilayer PCB 2802, an interior surface of a through hole is plated with a conductive material except along a first length/gap/void/clearance 2818a between a first plating resist material 2804 and a second plating resist material 2805, and a second length/gap/void/clearance 2818b between a third plating resist material 2807 and a fourth plating resist material 2809 to form the partitioned plated through hole 2816 having a first via segment 2808, a second via segment 2814, and a third via segment 2810, electrically isolated from one another.

Note that the via segmentation process illustrated in FIG. 28 serves to form an internal or embedded via segment 2814 in a single plating process and without any additional processing after lamination of the multilayer PCB 2802. This internal or embedded via segment 2814 may be formed even when the first via segment 2808 and/or second via segment 2810 are not formed.

Figure 29:
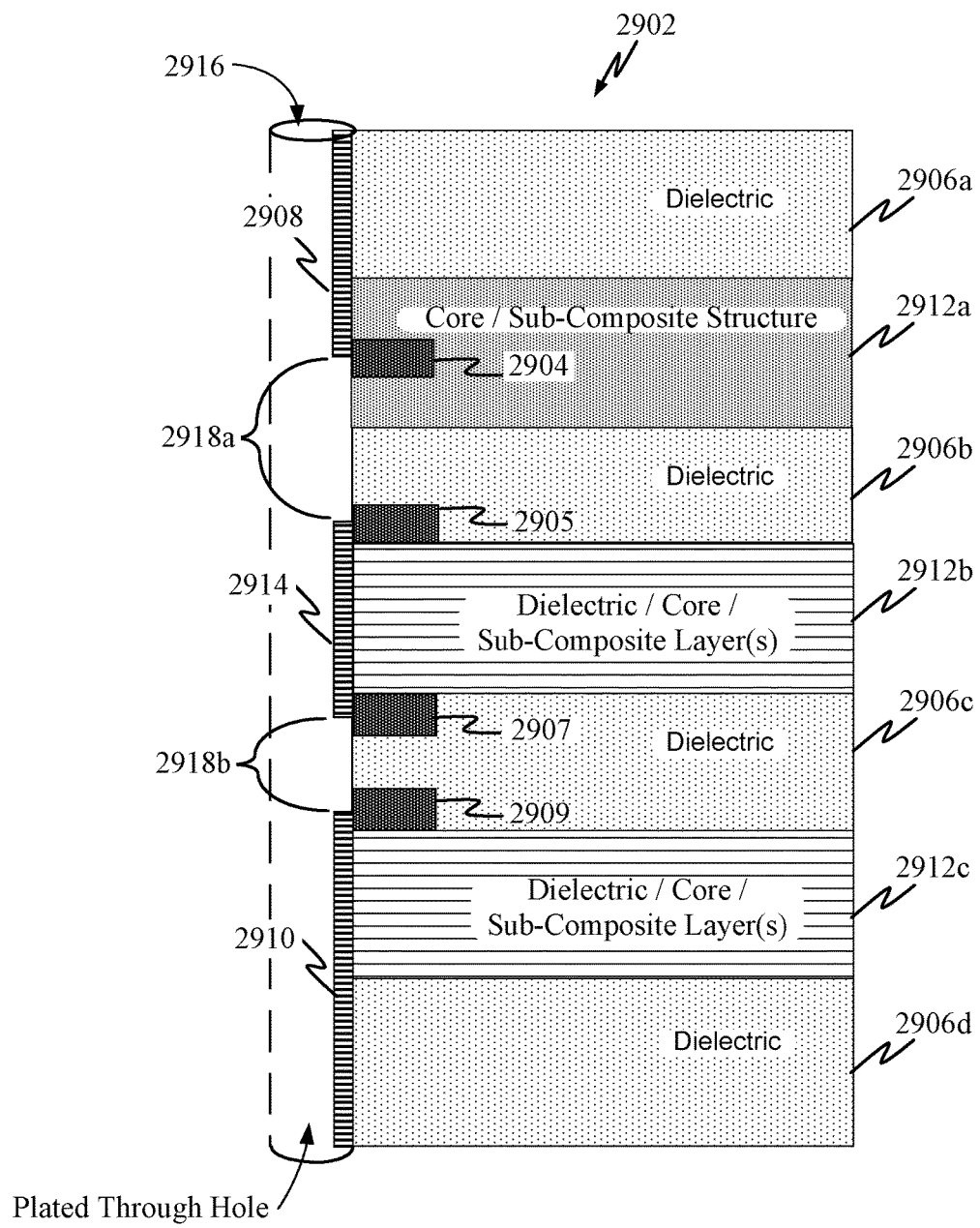
FIG. 29 illustrates a cross-sectional view of a portion of yet another multilayer PCB having a plurality of wide (longitudinal) gaps/voids/clearances formed within a plated through hole by using multiple points having plating resist material in a core or sub-composite structure and plating resist material in one or more dielectric layers.

FIG. 29 illustrates a cross-sectional view of a portion of yet another multilayer PCB 2902 having a plurality of wide (longitudinal) gaps/voids/clearances 2918a and 2918b formed within a plated through hole 2916 by using multiple points having plating resist material 2904 in a core or sub-composite structure and plating resist material 2905, 2907, and 2909 in one or more dielectric layers 2906b and 2906c. The multilayer PCB 2902 may include a plurality of dielectric layers 2906a, 2906b, 2906c, and/or 2906d, a plurality of dielectric layers, core structures, or sub-composite structures 2912a, 2912b, and/or 2912c. Within the multilayer PCB 2902, the gaps/voids/clearances 2918a and 2918b may be formed between the two plating resist materials 2904/2905 or 2907/2909, respectively. In one example, a first plating resist 2904 has been deposited within a first core or sub-composite structure 2912a and a second plating resist 2905 has been deposited on a first surface of a second core or sub-composite structure 2912b. Similarly, a third plating resist material 2907 has been deposited on a second surface of the second core or sub-composite structure 2912b and a fourth plating resist has been deposited on a first surface of a third core or sub-composite structure 2912c. Subsequently, when the plated through hole 2916 is formed through the multilayer PCB 2902, an interior surface of a through hole is plated with a conductive material except along a first length/gap/void/clearance 2918a between the first plating resist 2904 and the second plating resist 2905, and a second length/gap/void/clearance 2918b between the third plating resist 2907 and the fourth plating resist 2909 to form the partitioned plated through hole 2916 having a first via segment 2908, a second via segment 2914, and a third via segment 2910, electrically isolated from one another.

Figure 30:
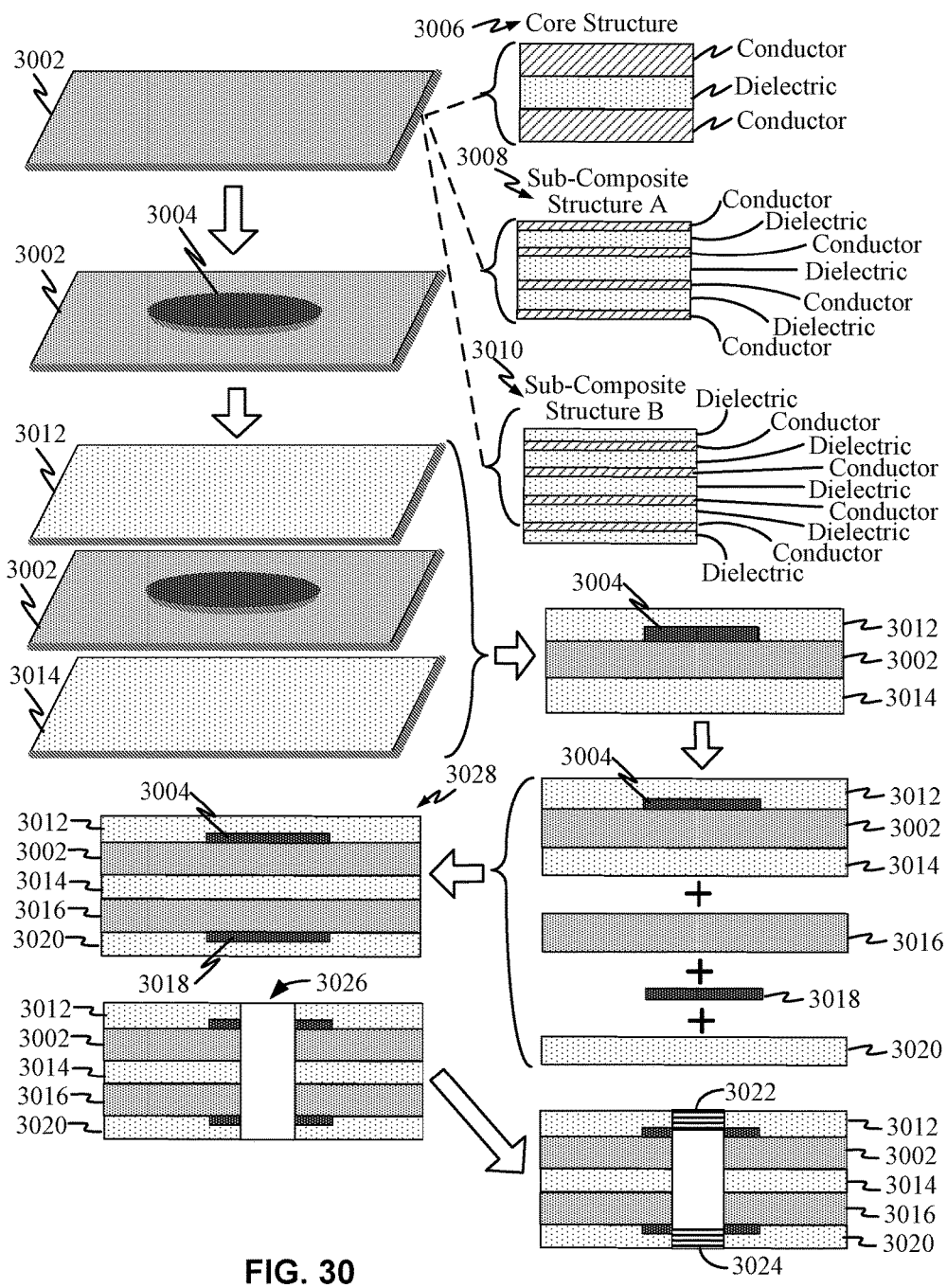
FIG. 30 illustrates the formation of a wide gap/void within a plated through hole by using multiple points of plating resist material.

FIG. 30 illustrates the formation of a wide gap/void within a plated through hole by using multiple points of plating resist material. First, a core structure or sub-composite structure 3002 may be formed. In one example, the core structure or sub-composite structure 3002 may be core structure 3006 having two conductive layers with a dielectric in between. In another example, the core structure or sub-composite structure 3002 may be a first sub-composite structure A 3008 or a second sub-composite structure B 3010, each comprising a plurality of conductive layers and dielectric layers.

A plating resist material 3004 may then be deposited on at least one surface of the core structure or sub-composite structure 3002. For instance, the plating resist material 3004 may be deposited up to a particular thickness and within a defined area or region (e.g., instead of across the whole layer. The defined area or region may correspond to an area through which a hole for a via is to pass.

A first dielectric material 3012 may then be deposited or laminated on one or both surfaces of the core structure or sub-composite structure 3002. The thickness of the first dielectric material 3012 may be at least as thick or thicker than a thickness of the plating resist material 3004. In this manner, a single plating resist material 3004 may be integrated within a PCB stackup. Additional plating resist materials may be similarly deposited within layers of a PCB stackup. For example, a second plating resist material 3018 may be similarly deposited on a second core structure or sub-composite structure 3016 which is laminated (e.g., either before or after) or otherwise coupled to the second dielectric material 3014. A third dielectric material 3020 may be deposited onto a surface of the second core structure or sub-composite structure 3016 and the second plating resist material 3018 to further build the PCB stackup 3026.

A through hole 3026 may then be formed through multiple layers of the PCB stackup 3028 and then plated to form a first plated via segment 3026 and a second plated via segment 3024 electrically isolated from each other. That is, in this example, when the hole 3026 is plated, conductive material is not plated between the first and second plating resist material 3004 and 3006, thereby creating a wide gap/void between the first and second via segments 3022 and 3024.

The examples of wide gaps/voids within a plated through hole illustrated in FIGS. 15, 16, 17, 18, and 20 may be formed in a way similar to the process illustrated in FIG. 30. Additionally, embedding of plating resist material with a core structure or sub-composite structure itself (e.g., illustrated in FIGS. 22, 24, 26, and 29) may also be achieved in a similar way during the lamination process of said structures.

In the foregoing specification, embodiments of the invention have been described with reference to numerous specific details that may vary from implementation to implementation. The specification and drawings are, accordingly, to be regarded in an illustrative rather than a restrictive sense. The invention is intended to be as broad as the appended claims, including all equivalents thereto.

Those skilled in the art would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

The invention claimed is:

1. A method of partitioning a via in a multilayer printed circuit board (PCB) as to produce an electrically isolating portion between two electrically conducting portions in said via, the method comprising of:
   placing at least one portion of a first plating resist layer on a first layered structure including a first conductive layer and a first dielectric layer, and placing at least one portion of a second plating resist layer on a second layered structure including a second conductive layer and a second dielectric layer;
   laminating the first and second layered structures with a third intermediate layered structure including at least one third dielectric layer adapted so that the portions of the first and second plating resist layers become embedded in the at least one third dielectric layer;
   drilling a first hole in the printed circuit board so that the first hole passes through the portions of the first and the second plating resist layer;
   placing the printed circuit board in a copper seed catalyzing bath so that a first copper layer is placed on an interior of the first hole except for portions with the plating resist layer;
   placing the printed circuit board in an electrolytic copper plating bath where the first copper layer placed on the at least one third dielectric layer portion of the first hole is electrically isolated from the first and second conductive layers so that additional copper is placed on the interior of the first hole except for portions of the first and second plating resist layers and except for a portion of the at least one third dielectric layer; and
   removing the first copper layer placed on the at least one third dielectric layer portion of the first hole after the electrolytic copper plating bath.

2. The method of claim 1, wherein removing copper from the at least one third dielectric layer portion of the first hole is done by etching.

3. The method of claim 1, wherein the at least one third dielectric layer is made of an impregnated fiber weave adapted to embed the portions of the first and second plating resist layers.

4. The method of claim 1, wherein the first hole is partly penetrating the printed circuit board.

5. The method of claim 1, wherein the first hole is a through hole through the printed circuit board.

6. The method of claim 5, wherein drilling the first hole comprises drilling with a larger drill from the opposite side of the printed circuit board as to produce two portions of the via with different diameters and wherein the two via portions meet each other in a position between the first and second plating resist layers.

\* \* \* \* \*